(12) United States Patent
Liu et al.

(10) Patent No.: US 6,352,896 B1
(45) Date of Patent: Mar. 5, 2002

(54) METHOD OF MANUFACTURING DRAM CAPACITOR

(75) Inventors: Haochieh Liu, Taipei; Hsi-Chuan Chen, Tainan; Jung-Ho Chang, Yun-Lin Hsiang; Hong-Hsiang Tsai, Hsinchu; Li-Ming Wang, Taoyuan; Sen-Huan Huang, Tainan; Bor-Ru Sheu, Hsinchu; Wen-Kuei Hsieh, Tainan Hsien, all of (TW)

(73) Assignee: Winbond Electronics Corp., Hsinchu (TW)

( * ) Notice: Subject to any disclaimer, the term of this patent is extended or adjusted under 35 U.S.C. 154(b) by 22 days.

(21) Appl. No.: 09/618,597

(22) Filed: Jul. 17, 2000

(30) Foreign Application Priority Data

Jun. 7, 2000 (TW) .......................................... 89111023

(51) Int. Cl.$^7$ .......................................... H01L 21/8242
(52) U.S. Cl. ...................... 438/253; 438/396; 438/672; 438/675
(58) Field of Search ................................ 438/253, 254, 438/241, 240, 243, 248, 256, 262, 396–398, 391, 381, 672, 675, 394–399

(56) References Cited

U.S. PATENT DOCUMENTS 5,998,225 A * 12/1999 Crenshaw et al. ............. 438/3

* cited by examiner

*Primary Examiner*—Charles Bowers
*Assistant Examiner*—Yennhu B. Huynh
(74) *Attorney, Agent, or Firm*—J. C. Patents

(57) ABSTRACT

A method of manufacturing DRAM capacitor. An active region is formed above a substrate. A plurality of parallel word lines is formed above the substrate. A first plug and a second plug are formed between the word lines in locations for forming the desired bit line contact and node contact, respectively. Insulation material is deposited into the remaining space between the word lines. A bit line contact is formed above the first plug. A plurality of parallel bit lines is formed above the substrate. The bit lines are perpendicular to the word lines. The bit line is electrically connected to the substrate through the bit line contact and the first plug. The bit lines are electrically insulated from each other. Furthermore, each bit line is covered on top by a hard material layer. Finally, a node contact is formed over the second plug.

26 Claims, 23 Drawing Sheets

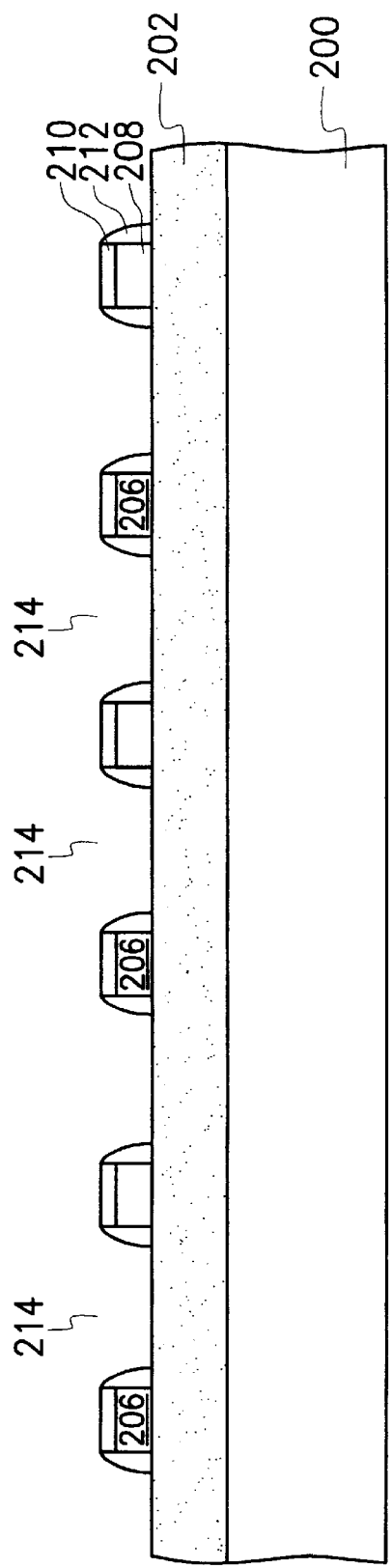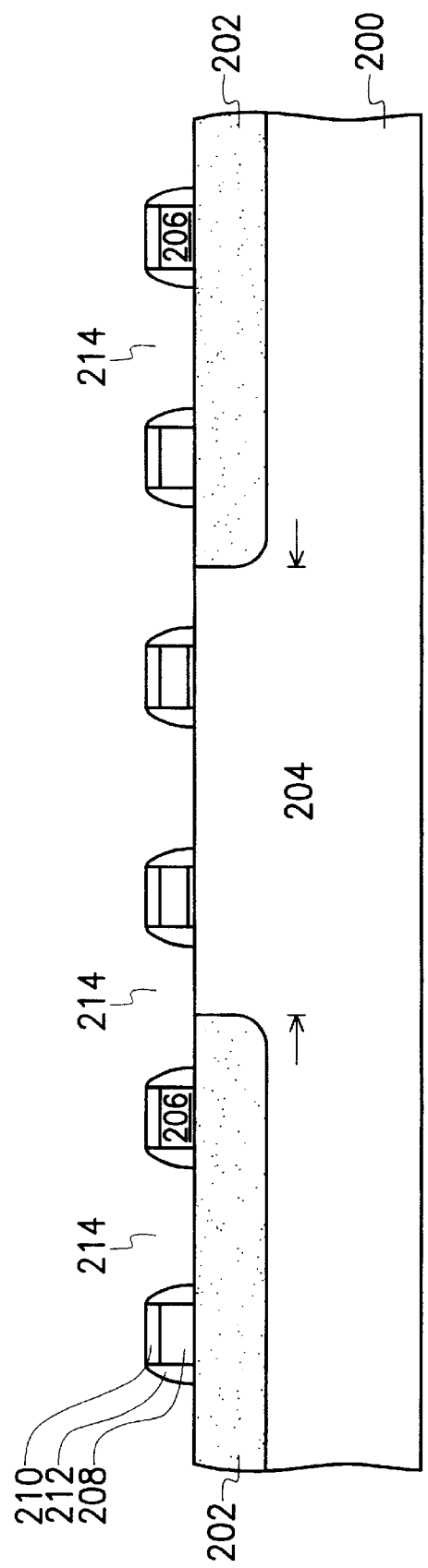

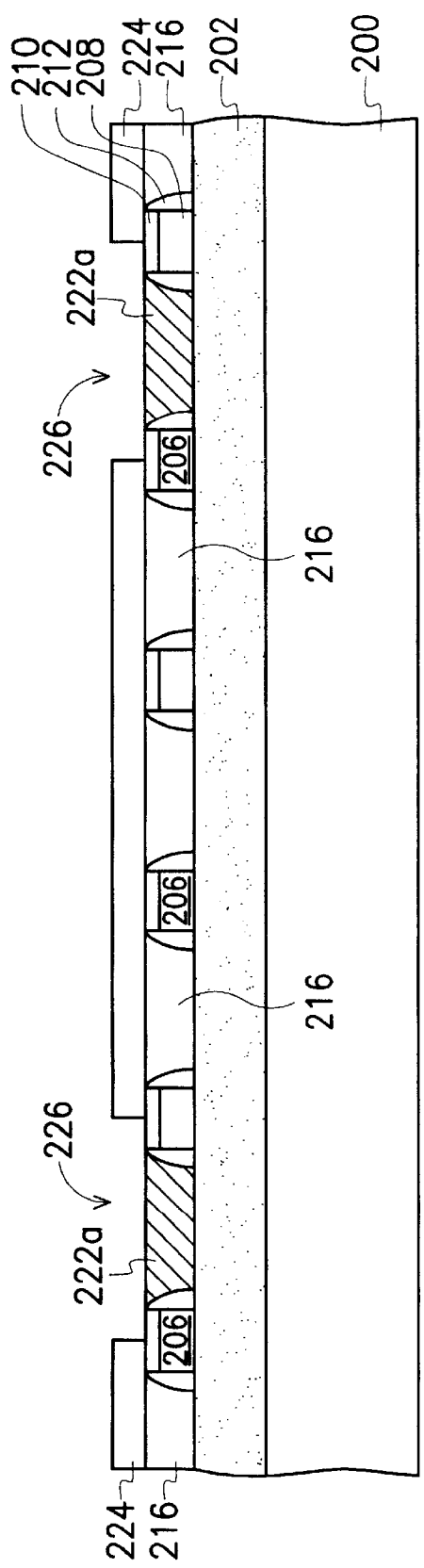
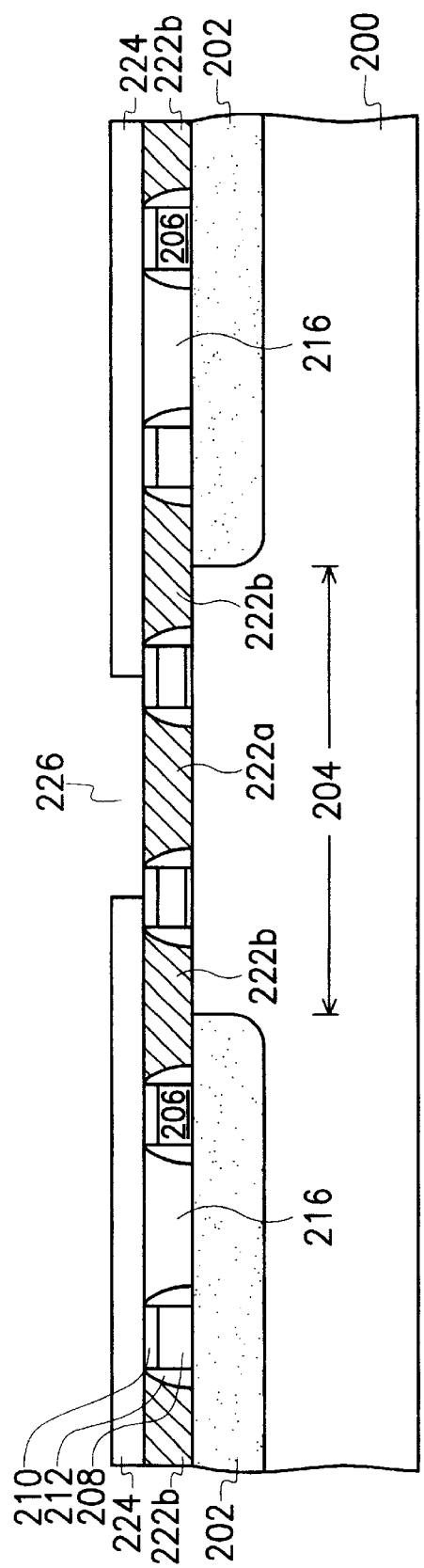
FIG. 3E
FIG. 4E

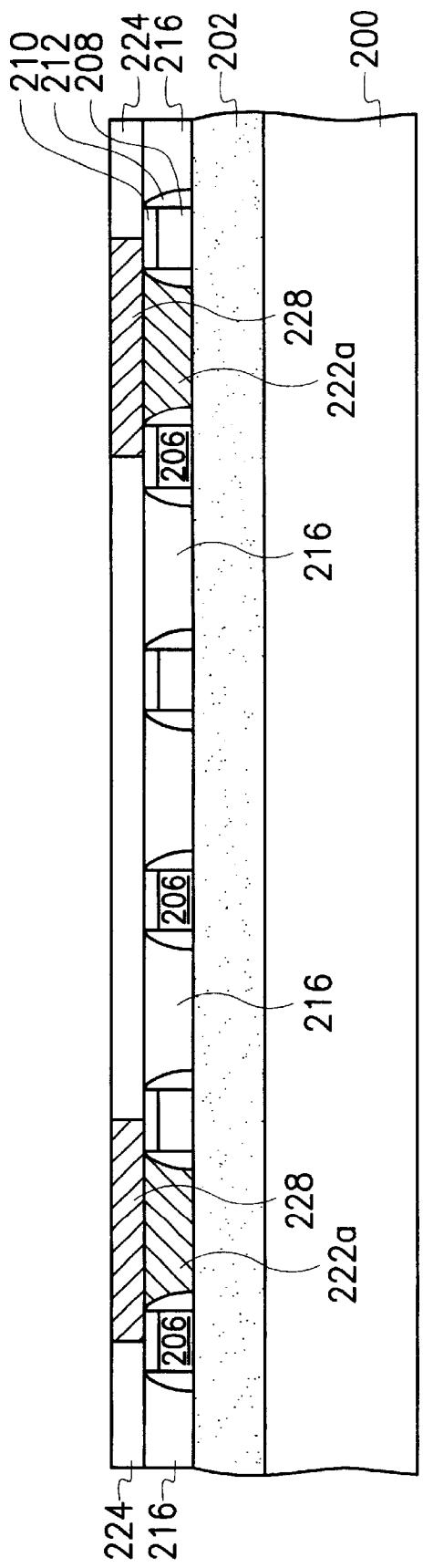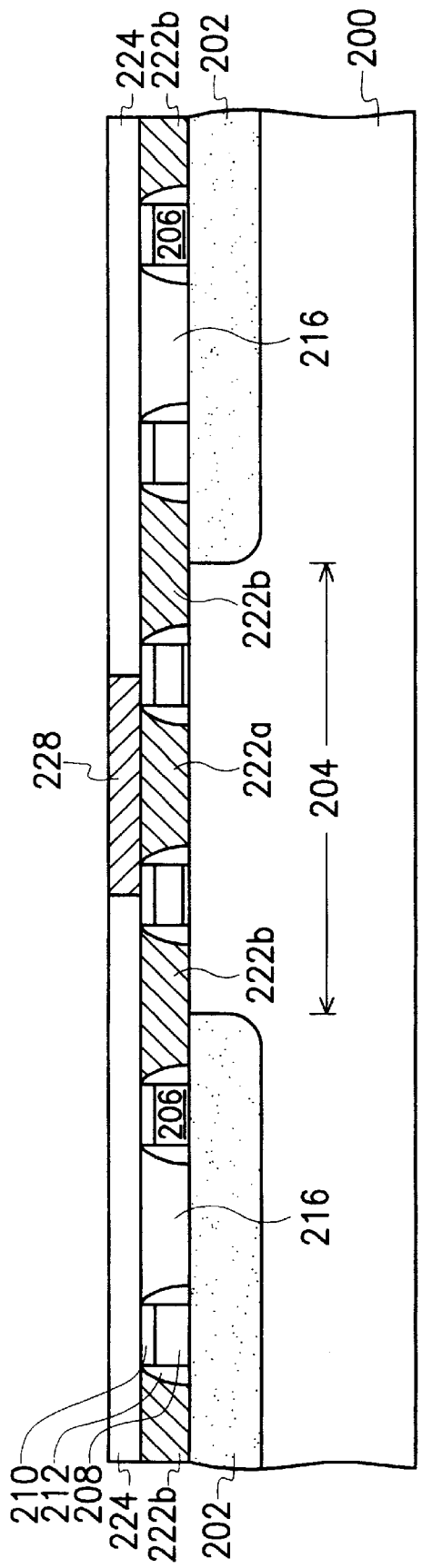

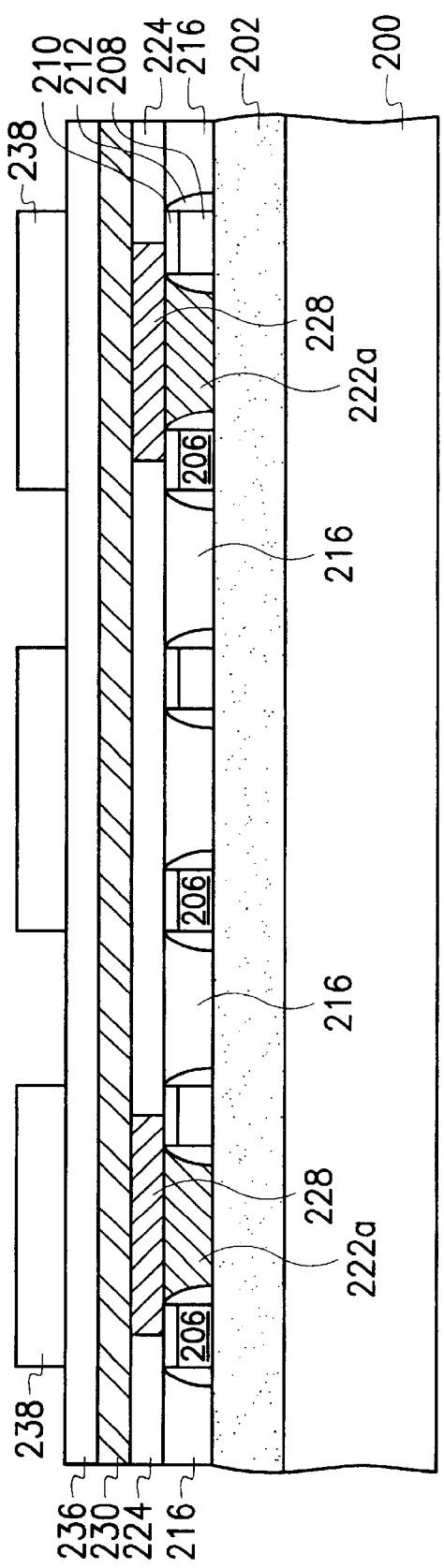
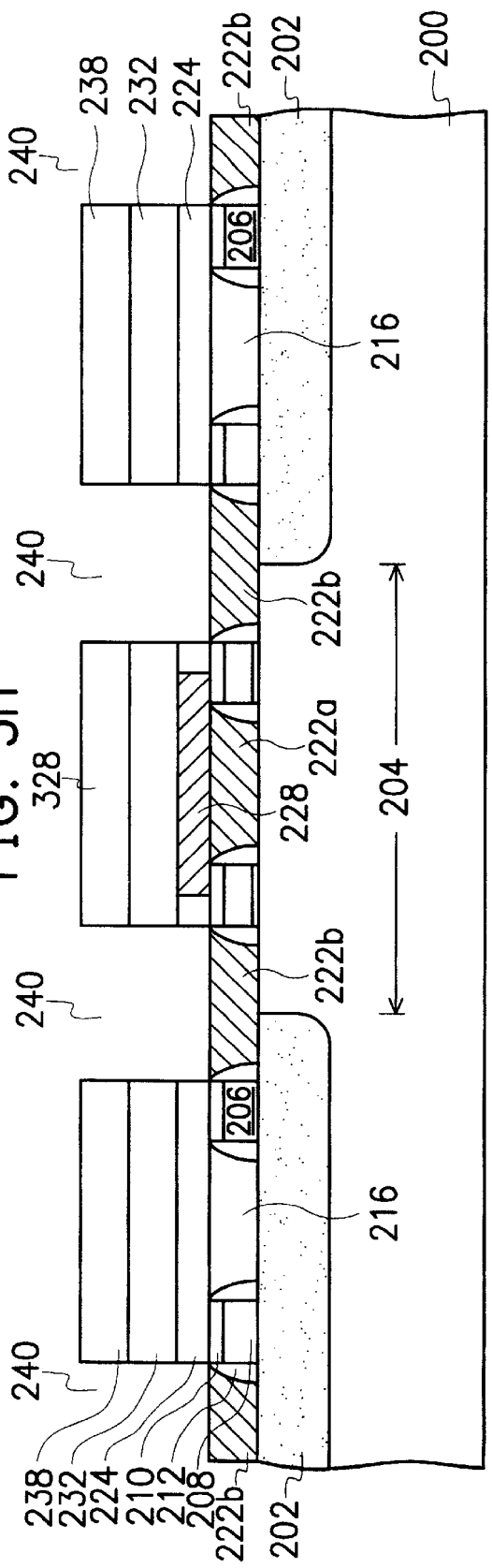

METHOD OF MANUFACTURING DRAM CAPACITOR

CROSS-REFERENCE TO RELATED APPLICATION

This application claims the priority benefit of Taiwan application Ser. No. 89111023, filed Jun. 7, 2000.

BACKGROUND OF THE INVENTION

1. Field of Invention

The present invention relates to a method of manufacturing semiconductors. More particularly, the present invention relates to a method of manufacturing the capacitor of deep sub-micron dynamic random access memory (DRAM).

2. Description of Related Art

DRAM is a widely used integrated circuit device in semiconductors, especially in the telecommunications industry. Hence, it is a common goal in the electronic industry to develop a DRAM that has a higher memory capacity through device miniaturization. However, how to retain original quality and reliability despite miniaturization is a difficult technical problem that needs to be solved.

The memory cell array of a conventional stack-type DRAM generally includes at least an active area (AA), a word line (WL), a patterned self-aligned contact (SAC), a patterned bit line contact (BLC), a patterned bit line (BL) and a node contact. Altogether, six optical masks are required to form all the relevant structures. FIG. 1 is a schematic cross-sectional view showing a conventional stack-type capacitor over a bit line (COB) DRAM. As shown in FIG. 1, an active region 104 is marked out of a substrate 100 by an isolation structure 102. The COB DRAM also includes word lines 106, bit lines 108 and a capacitor 110. The bit lines 108 are electrically connected to the substrate 100 through a self-aligned contact 112. Similarly, the capacitor 110 is electrically connected to the substrate 100 through a node contact 114. The word line 106, the bit line 108 and the capacitor 110 are electrically insulated from each other by dielectric layers 116.

The six masking operations includes: a mask for forming an island pattern in the active region 104, two masks for forming the word lines 106 and the line/space pattern, three masks for forming the contact hole pattern of the self-aligned contact 112, the bit line contact and the node contact 114. As dimensions of each DRAM device shrinks, design rules for fabricating the devices become more restrictive. Hence, electrical contacts become harder to produce.

In addition, the amount of overlap and the alignment between different photomasks have to be increasingly accurate. Thus, the process window for forming a stack-type DRAM is limited.

SUMMARY OF THE INVENTION

Accordingly, one object of the present invention is to provide a method of manufacturing a DRAM capacitor capable of improving the process window and overlay margin.

To achieve these and other advantages and in accordance with the purpose of the invention, as embodied and broadly described herein, the invention provides a method of manufacturing a DRAM capacitor. An active region is formed above a substrate. A plurality of parallel word lines is formed above the substrate. A first plug and a second plug are formed between the word lines in locations for forming the desired bit line contact and the node contact, respectively. Insulation material is deposited into the remaining space between the word lines. A bit line contact is formed above the first plug. Next, a plurality of parallel bit lines is formed above the substrate, and the bit lines are perpendicular to the word lines. The bit lines, which are electrically insulated from each other, are electrically connected to the substrate through the bit line contact and the first plug. Furthermore, each bit line is covered on top by a hard material layer. Finally, a node contact is formed over the second plug.

This invention also provides an alternative method of manufacturing a DRAM capacitor. An active region is marked out in a substrate. A plurality of mutually parallel word lines is formed over the substrate. The word lines are separated from each other by spaces. Insulation material is deposited into the space between the word lines to form a first insulation layer. The first insulation layer is patterned to form a first self-aligned contact opening for forming the bit line contact and a second self-aligned contact opening for forming the node contact. Conductive material is deposited into the first and the second self-aligned contact opening to form a first self-aligned contact and a second self-aligned contact, respectively. A second insulation layer is formed over the word lines. The second insulation layer is patterned to form a bit line contact opening. Conductive material is again deposited into the bit line contact opening to form a bit line contact. Hence, the bit line contact is electrically connected to the substrate via the first self-aligned contact. In the subsequent step, a dielectric layer is formed over the second insulation layer. The dielectric layer is patterned to form a plurality of parallel trenches running perpendicular to the word lines. Conductive material is deposited into the trenches to form bit lines. The upper surface of the bit lines is lower than the upper surface of the dielectric layer. In addition, the bit line is electrically connected to the first self-aligned contact via the bit line contact. A hard material layer is formed over the bit lines that fill the remaining space of the trenches. The dielectric layer and the second insulation layer are patterned to form a node contact opening. Conductive material is deposited into the node contact opening to form a node contact. The node contact is electrically connected to the substrate via the second self-aligned contact.

In this invention, the self-aligned contacts and the node contacts are formed by a self-aligned process. Hence, both the process window and the overlay margin improve.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3A through 3I are cross-sectional views along line 3—3 in FIGS. 2A through 2I, respectively;

FIGS. 4A through 4I are cross-sectional views along line 4—4 in FIGS. 2A through 2I, respectively;

DESCRIPTION OF THE PREFERRED EMBODIMENTS

Figure 1:
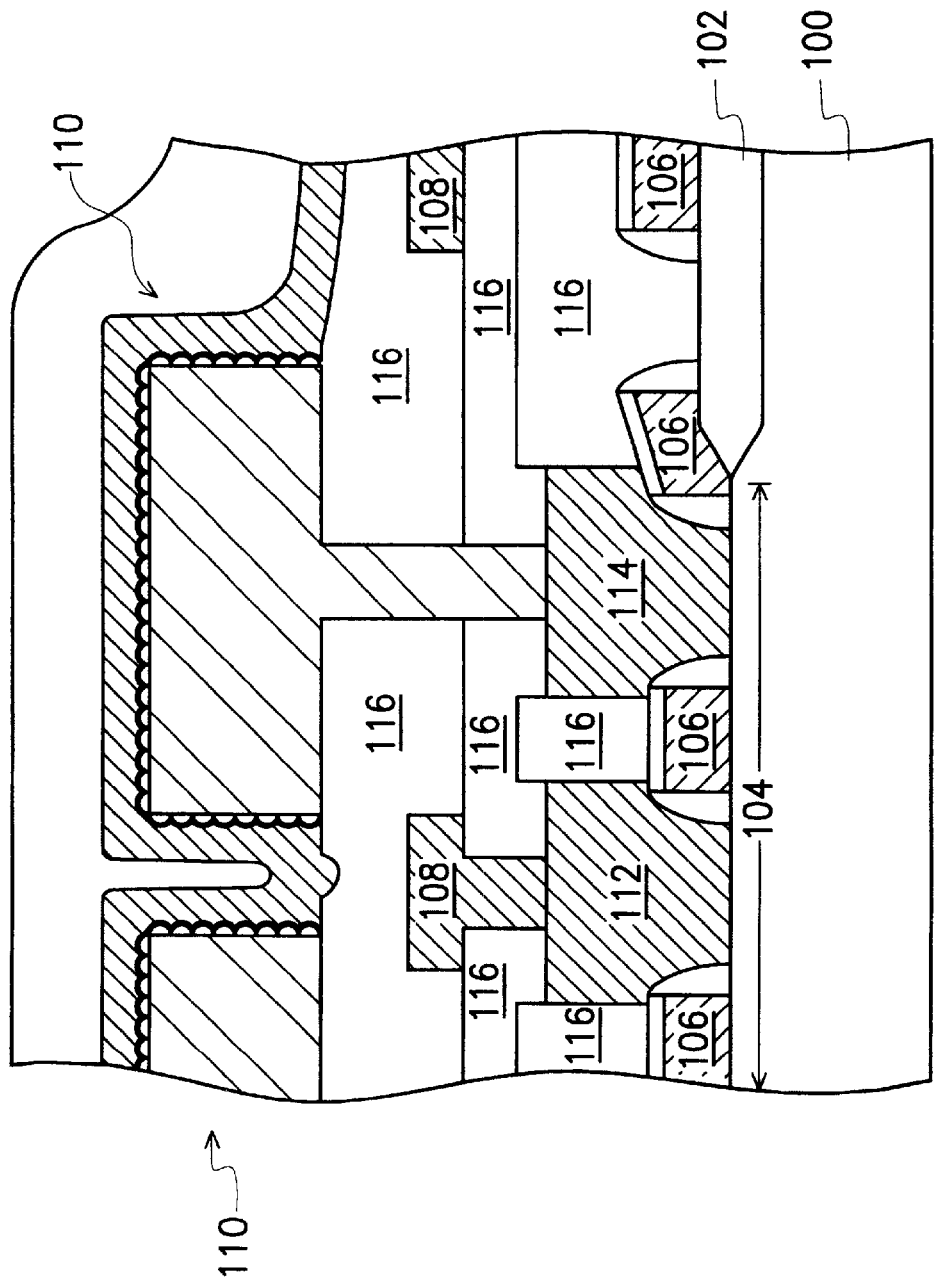
FIG. 1 is a schematic cross-sectional view showing a conventional stack-type capacitor over bit line (COB) DRAM.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2I are top layout views showing the progression of steps for forming the DRAM capacitor according to one preferred embodiment of this invention. FIGS. 3A through 3I are cross-sectional views along line 3—3 in FIGS. 2A through 2I, respectively, while FIGS. 4A through 4I are cross-sectional views along line 4—4 in FIGS. 2A through 2I, respectively.

Figure 2A:
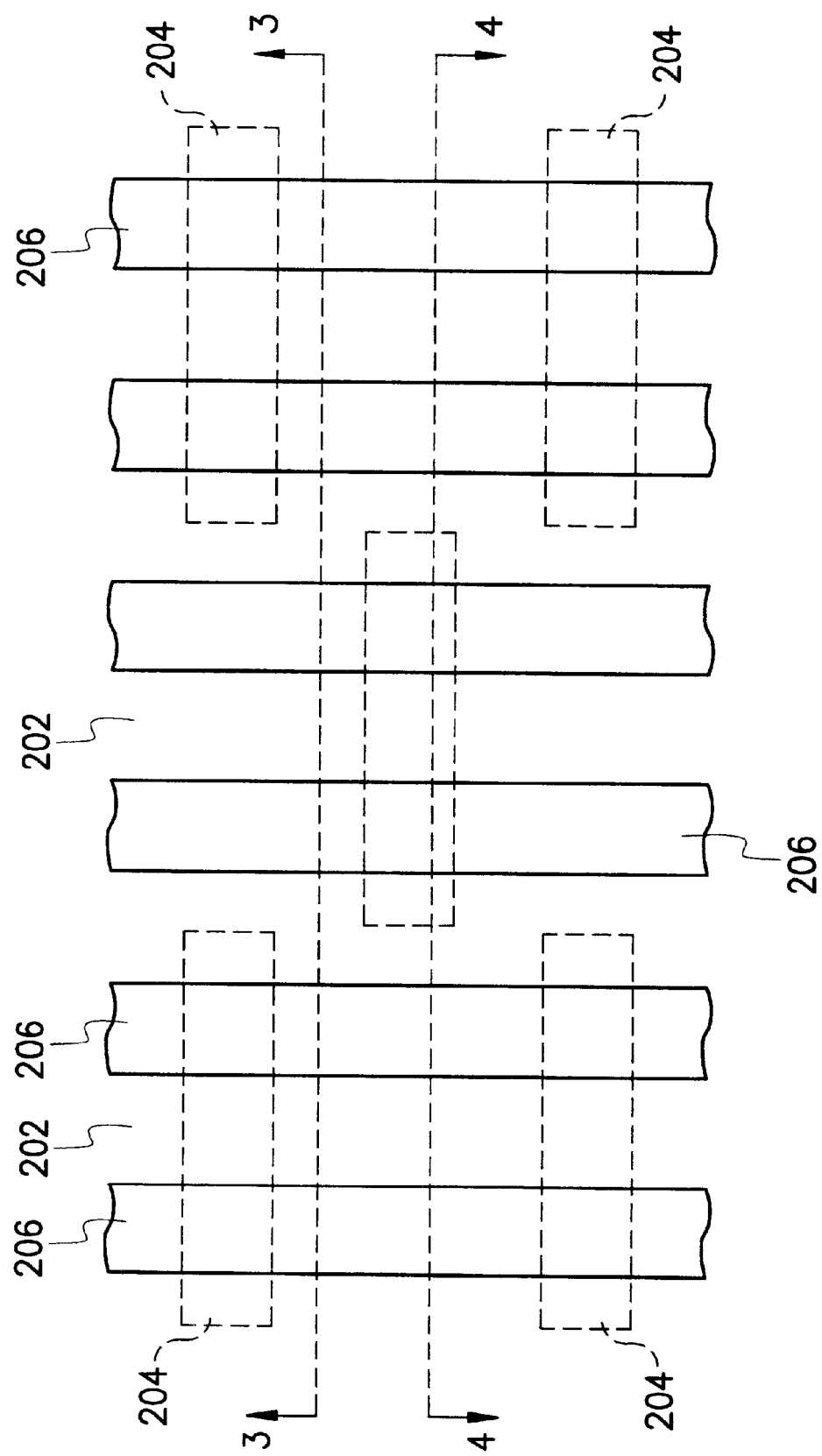
FIGS. 2A through 2I are top layout views showing the progression of steps for forming the DRAM capacitor according to one preferred embodiment of this invention.

As shown in FIGS. 2A, 3A and 4A, device isolation structures 202 are formed in a substrate 200. The device isolation structures 202 mark out the active region 204 (AA) for forming the field effect transistor (FET) and the capacitor. The isolation structures 202 can be shallow trench isolation (STI) formed by a conventional method, for example.

A plurality of parallel word lines 206 is formed over the substrate 200. The word line 206 is formed, for example, by forming a gate oxide layer (not shown) on the substrate 200. A conductive layer 208 and a cap insulation layer 210 are sequentially formed over the gate oxide layer. The insulation layer 210, the conductive layer 206 and the gate oxide layer are patterned. Spacers 212 made from a hard material are then formed on the sidewalls of the conductive layer 208 to form the word line 206 as shown in FIGS. 3A and 4A. The word lines 206 are separated from each other by a space 214.

The conductive layer 208 functions as the gate electrode of a field effect transistor. The conductive layer 208 can be a doped polysilicon layer or other formed using other conductive material. The insulation layer 210 and the hard material spacers are preferably formed from silicon nitride. The source/drain regions (not shown) of the field effect transistor are formed in the substrate 200 on each side of the word line 206. The word lines 206 are formed by photolithographic and etching operations using an equal width line/space photoresist pattern. Hence, the largest processing window that meets the manufacturing and electrical requirements is provided.

Figure 2B:
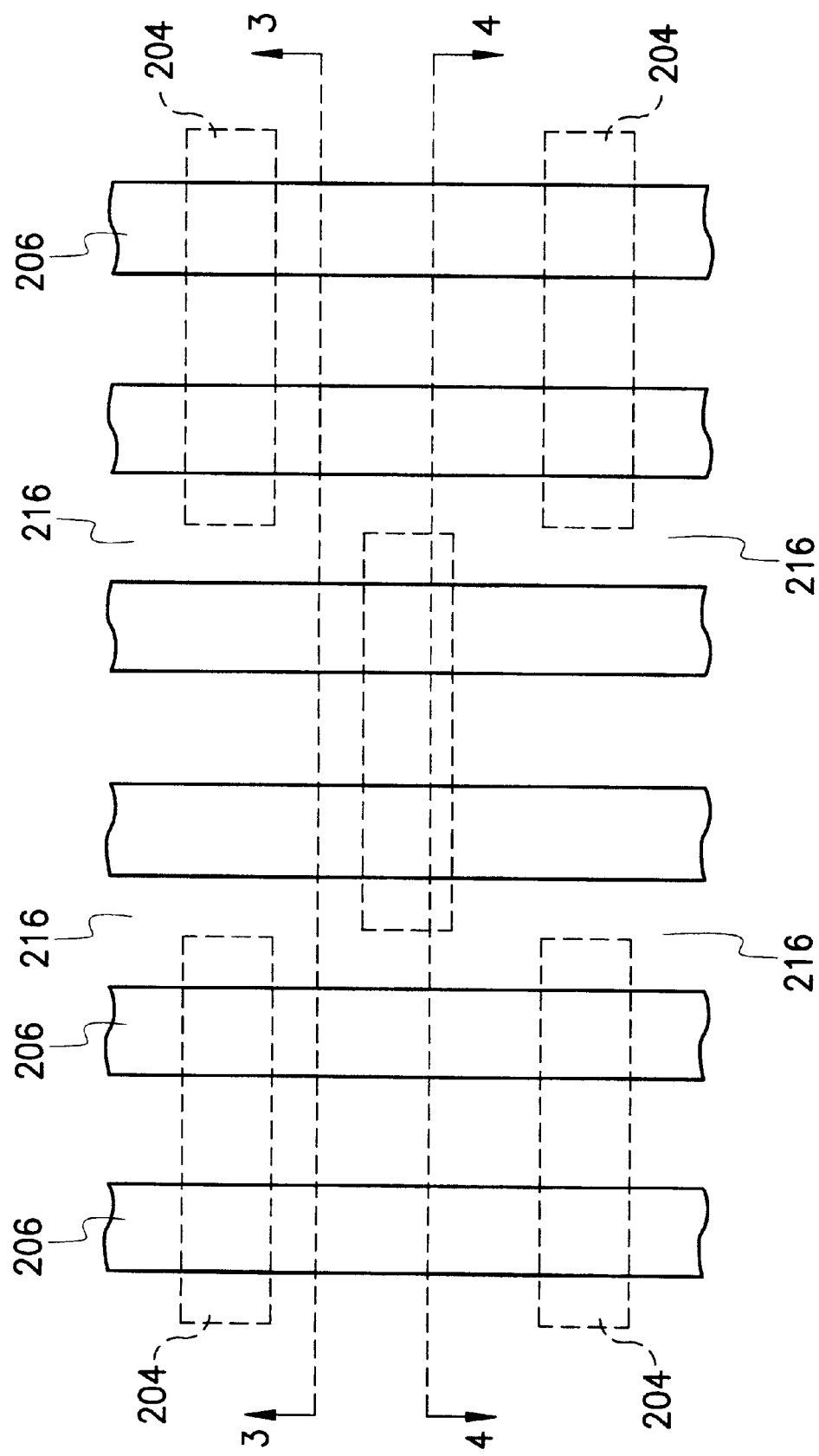
Figure 3B:
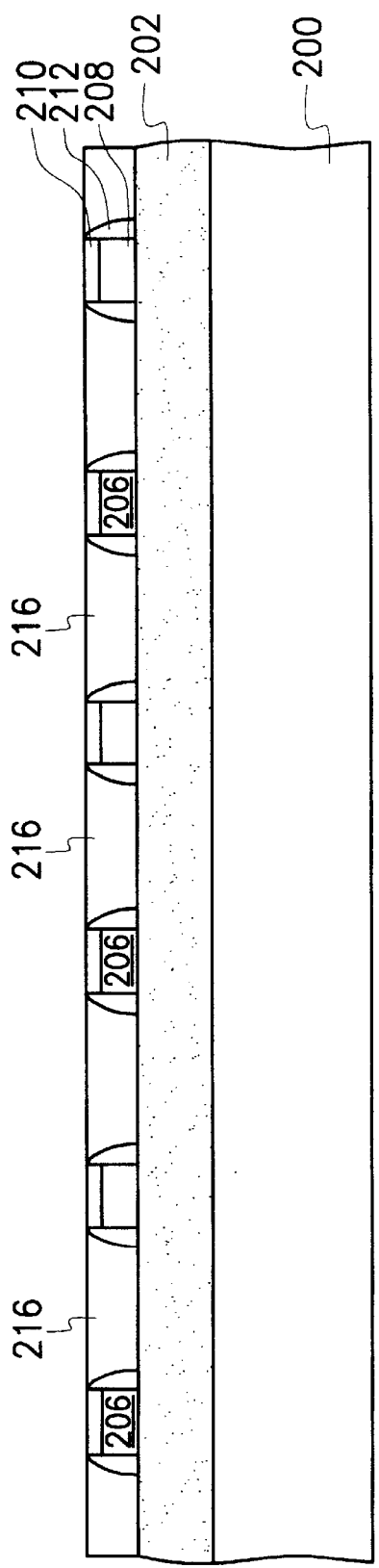
Figure 4B:
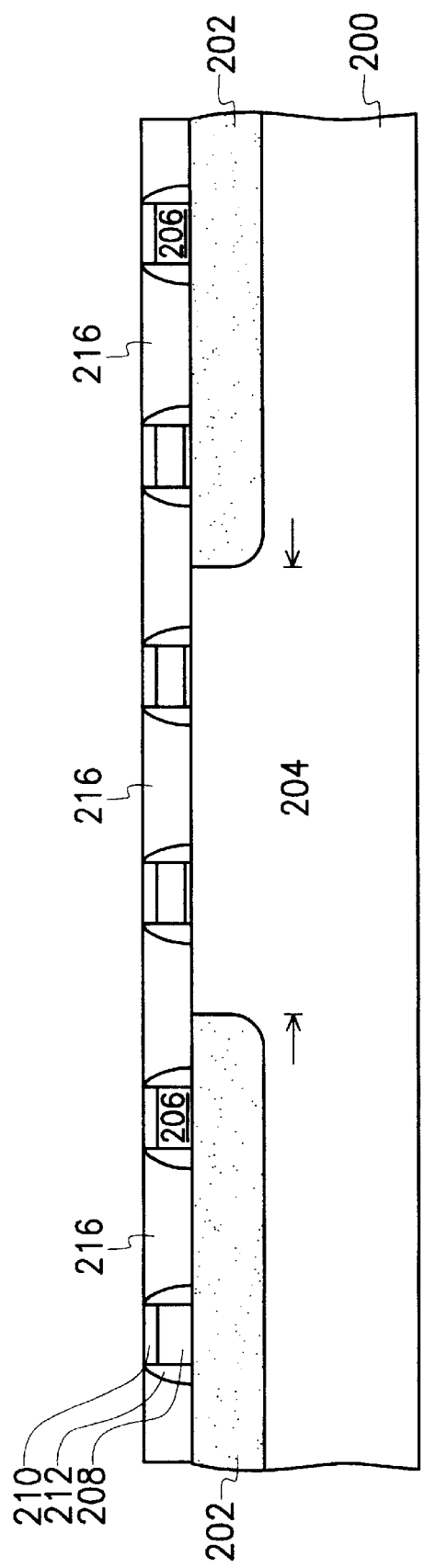

As shown in FIGS. 2B, 3B and 4B, insulation material is deposited into the space 214 between the word lines 206 to form an insulation layer 216. The insulation layer 216 is formed, for example, by depositing a layer of insulation material over the substrate 200 by chemical vapor deposition. A chemical-mechanical polishing is next carried out, using the insulation layer 210 as a stop layer. A portion of the insulation layer 216 is removed to expose the top surface of the insulation layer 210.

Figure 2C:
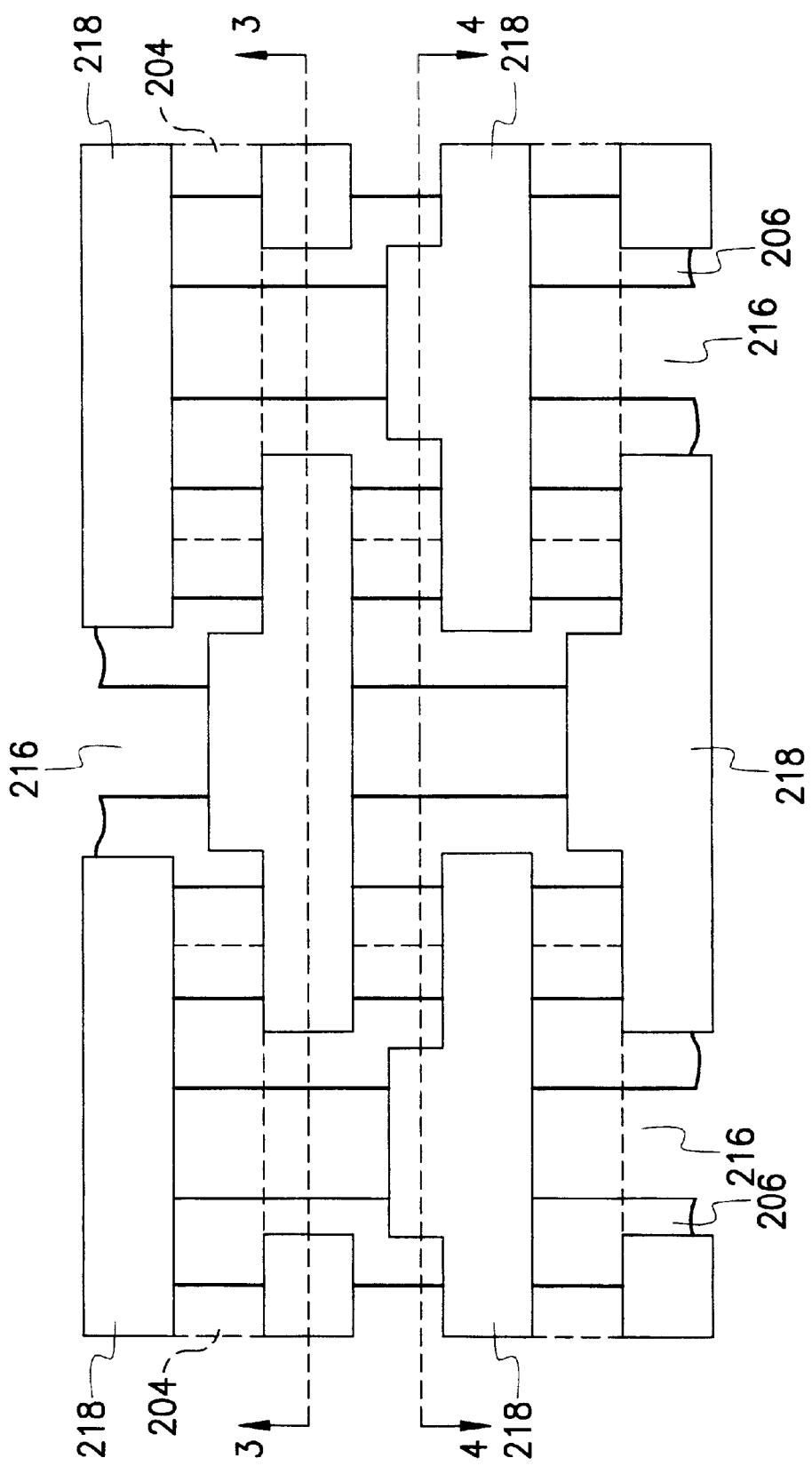
Figure 3C:
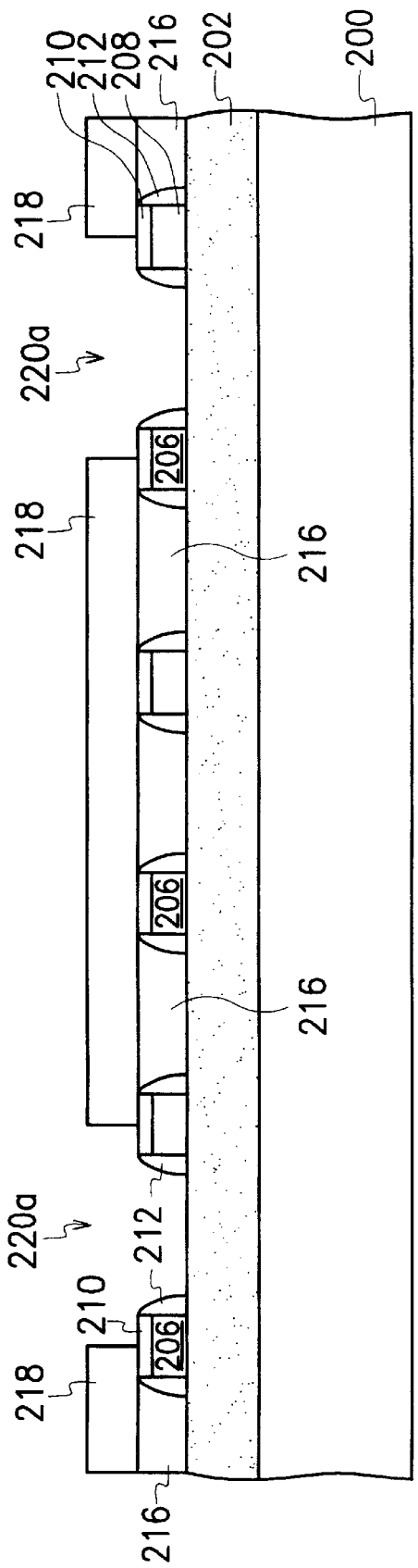
Figure 4C:
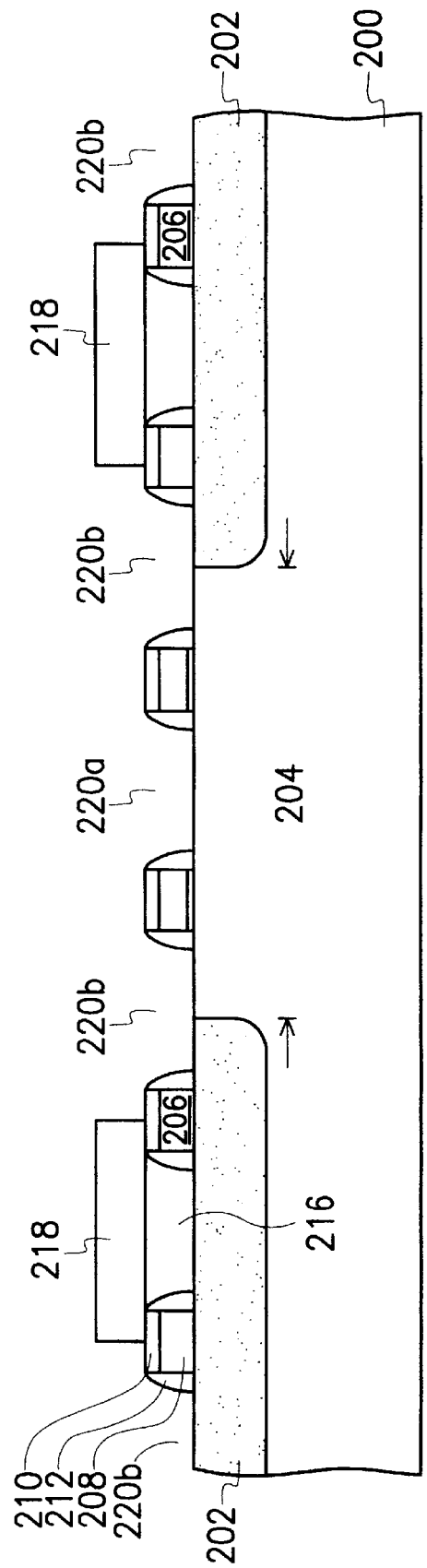

As shown in FIGS. 2C, 3C and 4C, the insulation layer 216 is patterned using a photoresist layer 218. A portion of the insulation layer 216 in the desired self-aligned contact (SAC) positions is removed to form a first self-aligned contact opening 220a and a second self-aligned contact opening 220b. The first self-aligned contact opening 220a is subsequently turned into a bit line contact while the second self-aligned contact opening 220b is subsequently turned into a node contact. The photoresist layer 218 is removed.

The self-aligned contact openings 220a and 220b can be formed using the non-continuous T-shaped island photoresist pattern 218 shown in FIG. 2C as a photomask. The photomask covers a portion of the word lines 206 and the insulation layer 216. Utilizing the high etching selectivity between silicon nitride in the insulation layer 210 and the hard material spacers 212 and the oxide in the insulation layer 216, a portion of the insulation layer 216 in the desired locations is removed. Hence, the self-aligned contact openings 220a and 220b that expose a portion of the substrate 200 are formed. The T-shaped island photoresist pattern 218 permits an increase in the process window for forming the self-aligned contact opening 220a and 220b.

Figure 5:
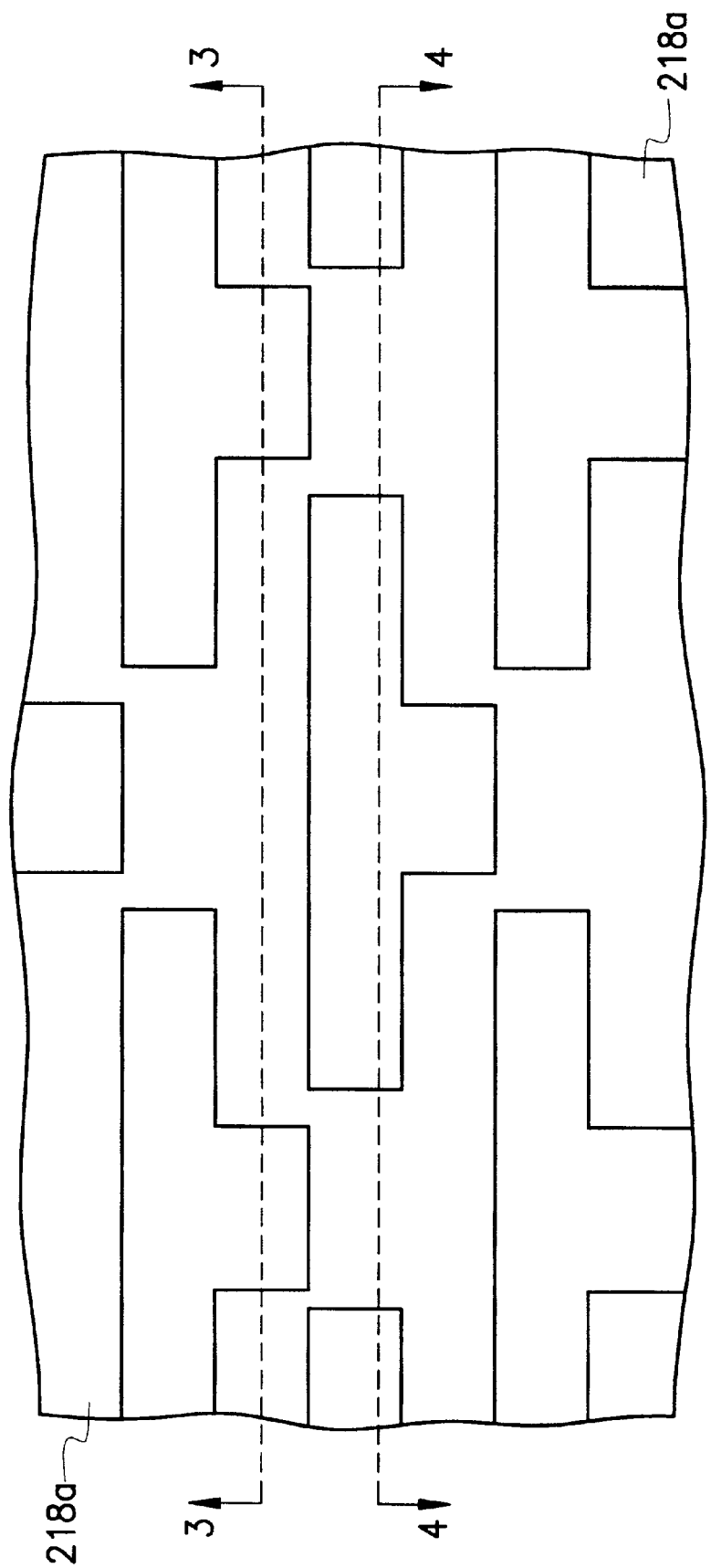
FIG. 5 is a top layout view showing the patterned photoresist layer for forming the self-aligned contact.

In addition, a continuous photoresist pattern 218a shown in FIG. 5 can also be used to form the self-aligned contact openings 220a and 220b. The photoresist pattern 218a has a cross-sectional profile similar to the photoresist layer 218a in FIG. 3C, also covering a portion of the word lines 206 and the insulation layer 216. Through the removal of the insulation layer 216 in the desired self-aligned contact positions, the self-aligned contact openings 220a and 220b are formed. The photoresist layer 218 is subsequently removed.

Figure 2D:
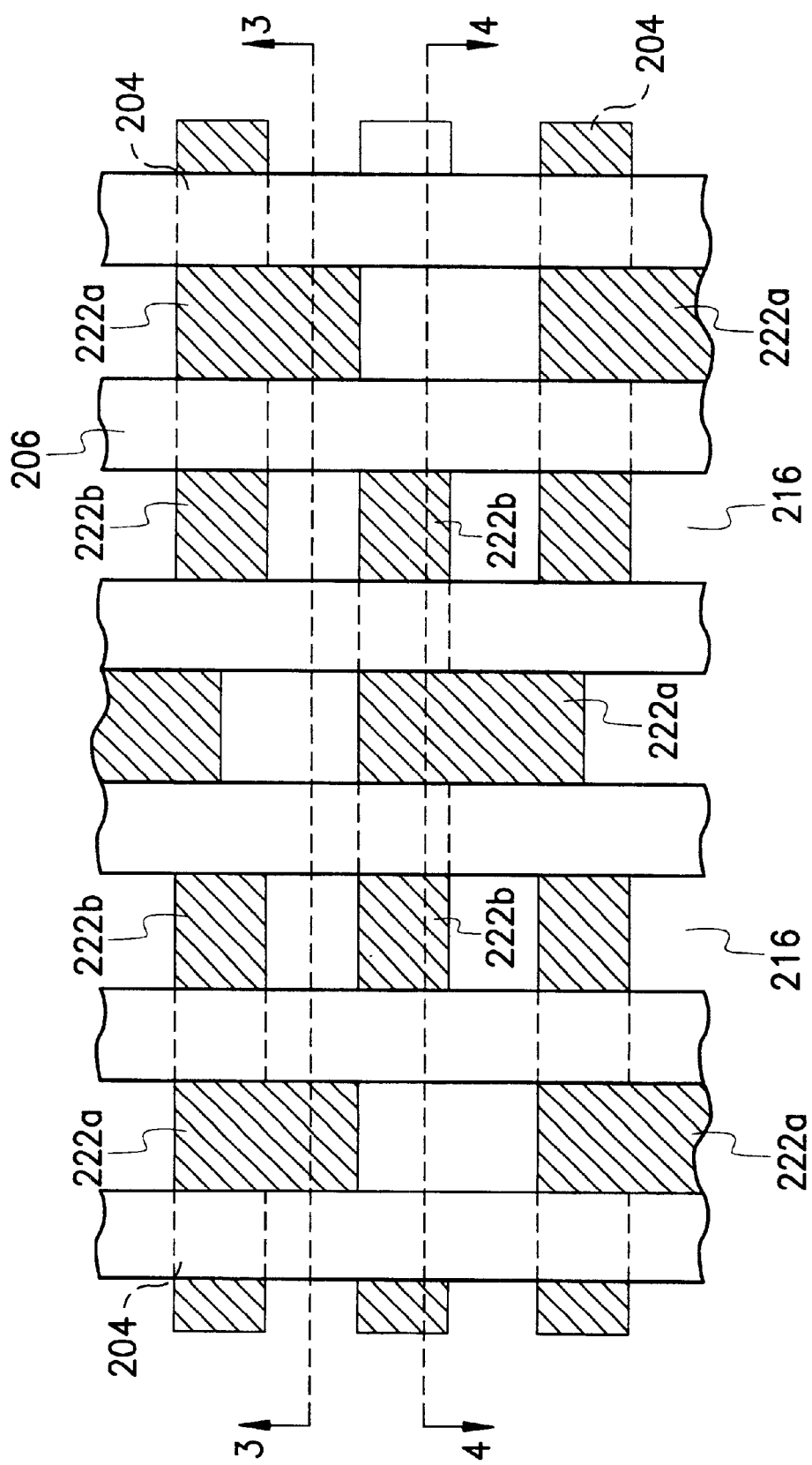
Figure 3D:
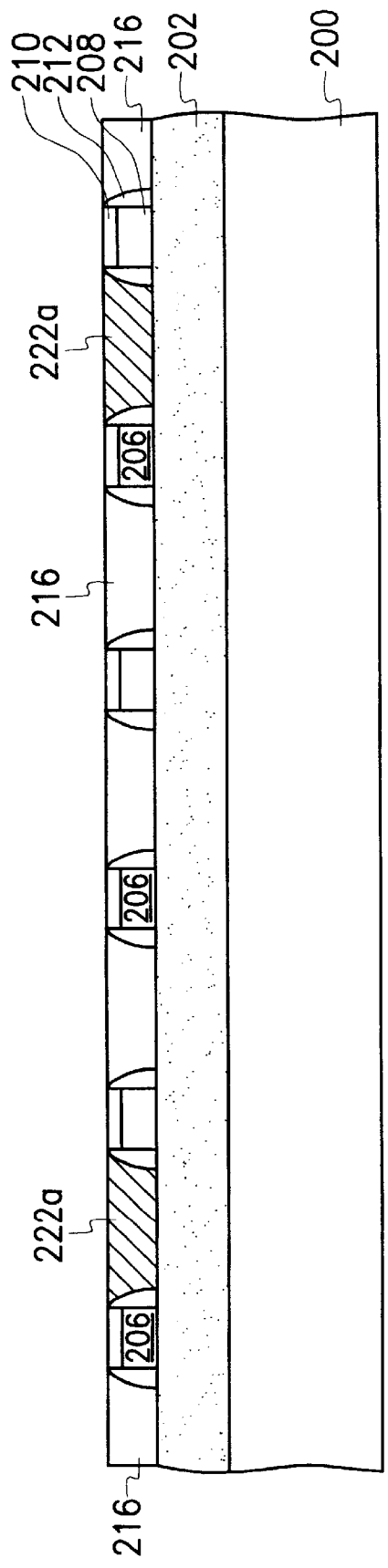
Figure 4D:
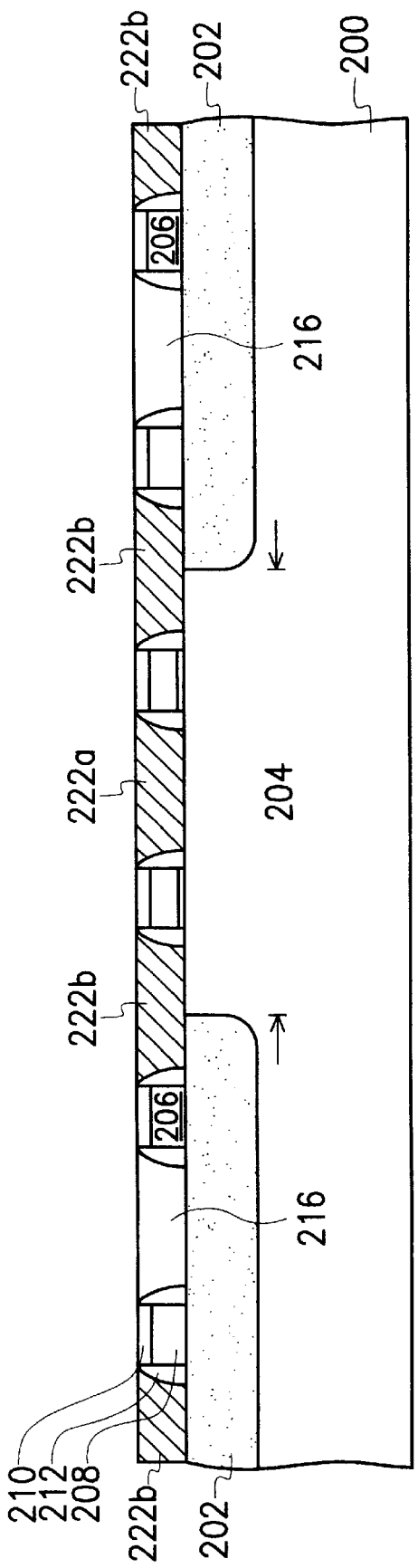

As shown in FIGS. 2D, 3D and 4D, conductive material is deposited into the first self-aligned contact opening 220a and the second self-aligned contact opening 220b to form a first plug 222a and a second plug 222b, respectively. The first plug 222a serves as an electrical connection between the subsequently formed bit line contact and the substrate 200. The second plug 222b serves as an electrical connection between the subsequently formed node contact and the substrate 200. The plugs 222a and 222b are formed by depositing conductive material such as polysilicon or tungsten over the word lines 206 in a chemical vapor deposition process. A chemical mechanical polishing is next carried out to remove the conductive layer above the insulation layer 210 while using the insulation layer as a polishing stop layer.

Figure 2E:
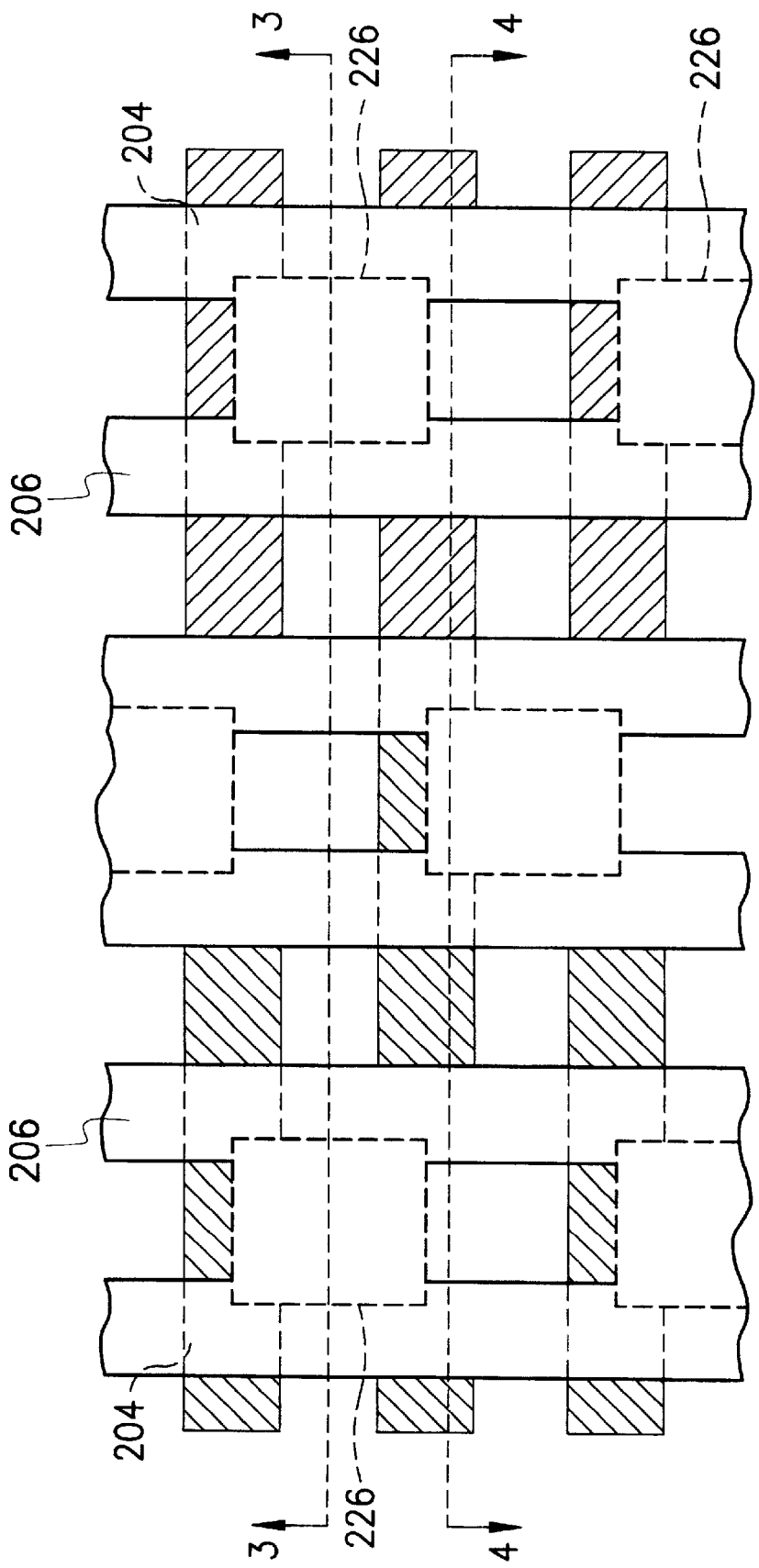

As shown in FIGS. 2E, 3E and 4E, an insulation layer 224 is formed over the word lines 206, the first plug 222a and the second plug 222b. Photolithographic and etching processes are conducted to pattern the insulation layer 224 such that a bit line contact opening 226 that exposes the first plug 222a is formed. The insulation layer 224 can be a thin oxide layer formed by chemical vapor deposition, for example. Since the etching selectivity ratio between the nitride in the insulation layer 210 and the oxide in the insulation layer 224 is high, the process of etching the insulation layer 224 stops at the insulation layer 210. Meanwhile, the word lines 206 are protected from any damage.

Figure 2F:
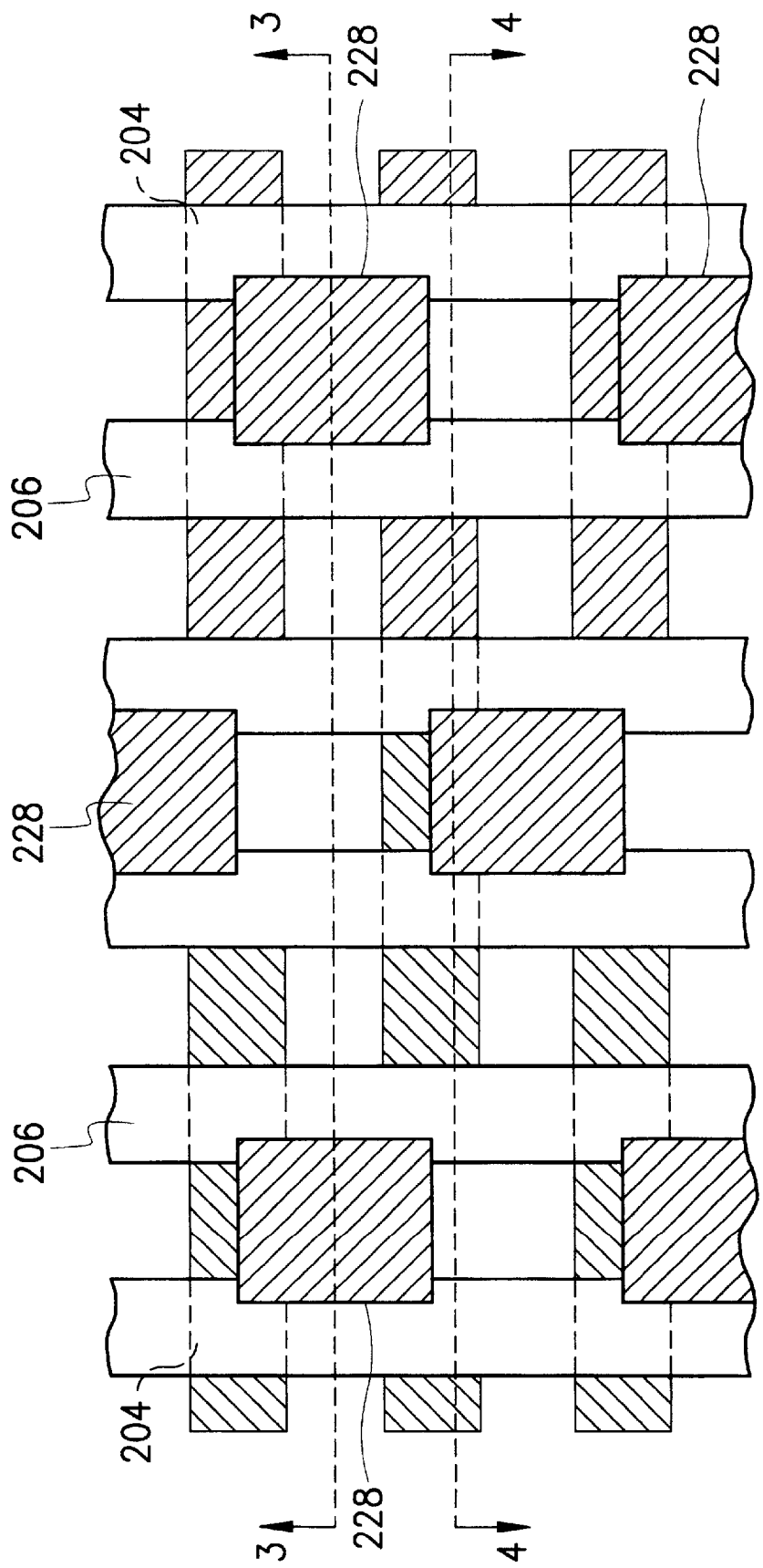

As shown in FIGS. 2F, 3F and 4F, conductive material such as polysilicon or tungsten is deposited over the insulation layer 224 by chemical vapor deposition. The conductive material fills the bit line contact opening 226 and extends over the surface of the insulation layer 224. Excess conductive material above the insulation layer 224 is removed by chemical-mechanical polishing, thereby forming a bit line contact 228 above the first plug 222a. The bit line contact 228 is electrically connected to the substrate 200 via the first plug 222a.

Figure 2G:
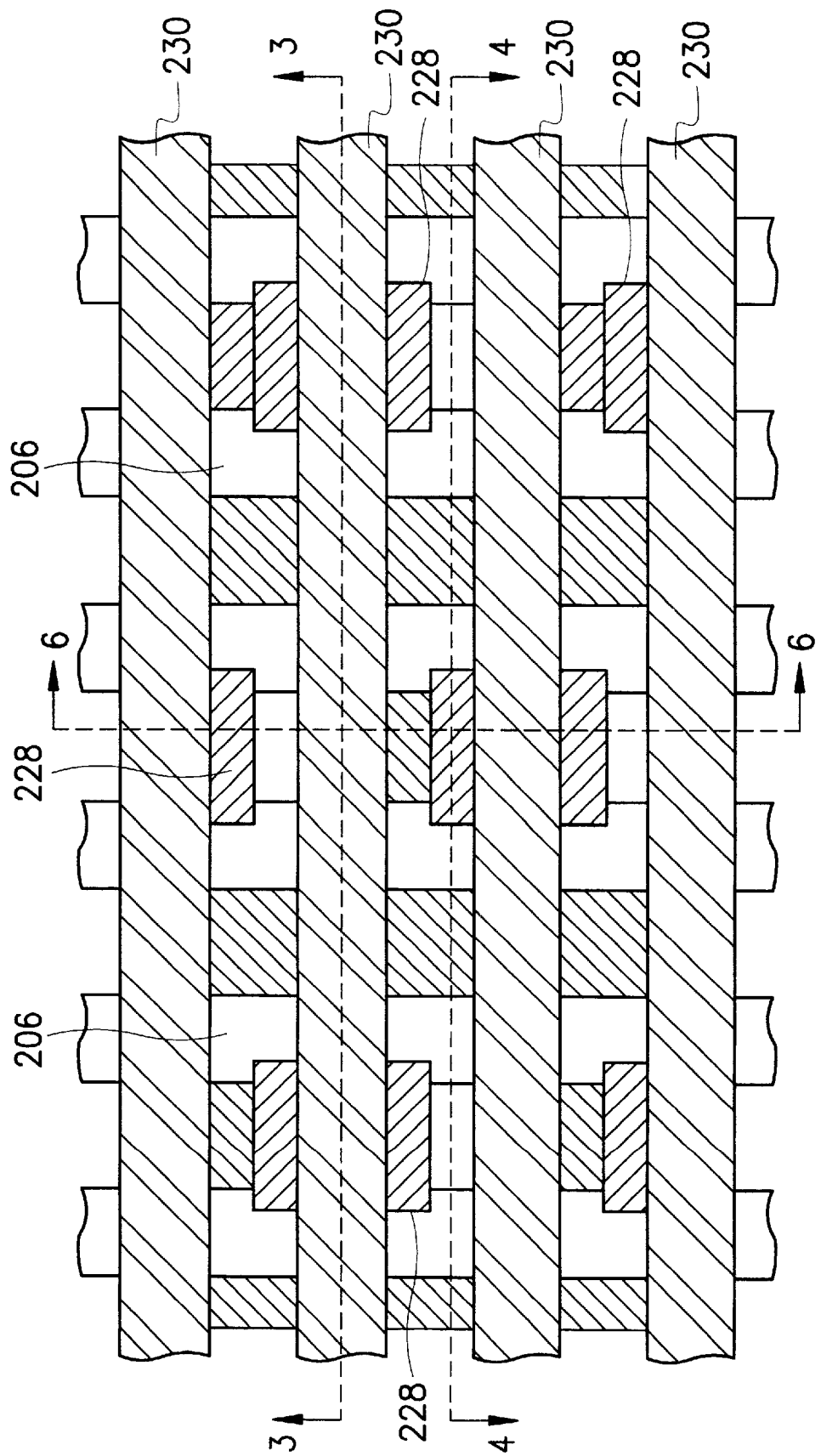
Figure 6A:
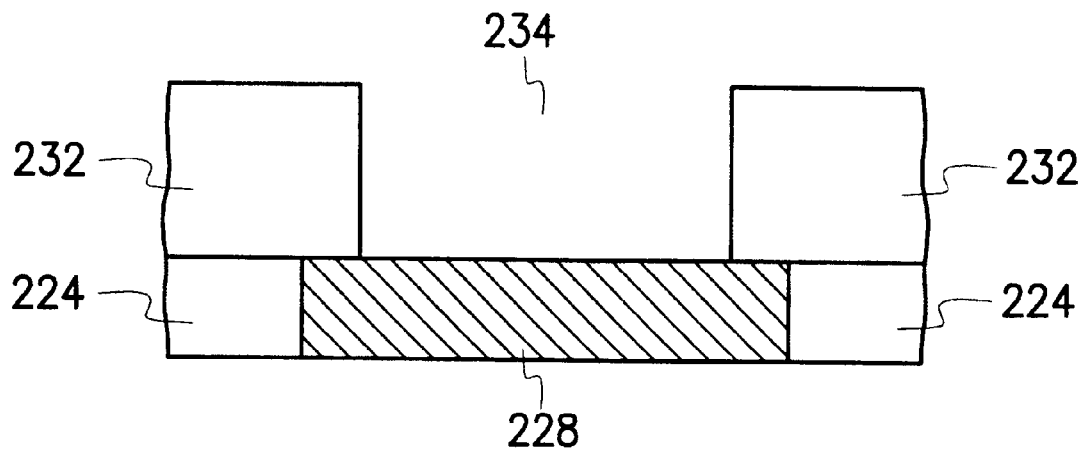
FIGS. 6A through 6D are cross-sectional views showing the progression of steps for forming the cross-section structure along line 6—6 of FIG. 2G.

FIGS. 6A through 6D are cross-sectional views showing the progression of steps for forming the cross-section structure along line 6—6 of FIG. 2G. As shown in FIGS. 2G, 3G, 4G and FIGS. 6A through 6D, a plurality of bit lines 230 are formed over the substrate 200. First, a blanket dielectric layer 232 layer is formed over the insulation layer 224 and the bit line contact 228 by depositing oxide in chemical vapor deposition. A photoresist layer having a bit line pattern is formed over the dielectric layer 232. The photoresist layer is subsequently used as a mask for patterning the dielectric layer 232 in photolithographic and etching operations. Ultimately, a plurality of parallel trenches 234 perpendicular to the word lines having a depth similar to the thickness of the dielectric layer 232 is formed as shown in FIG. 6A. In addition, the trenches 234 must run over and expose a portion of the bit line contact 228.

Figure 3G:
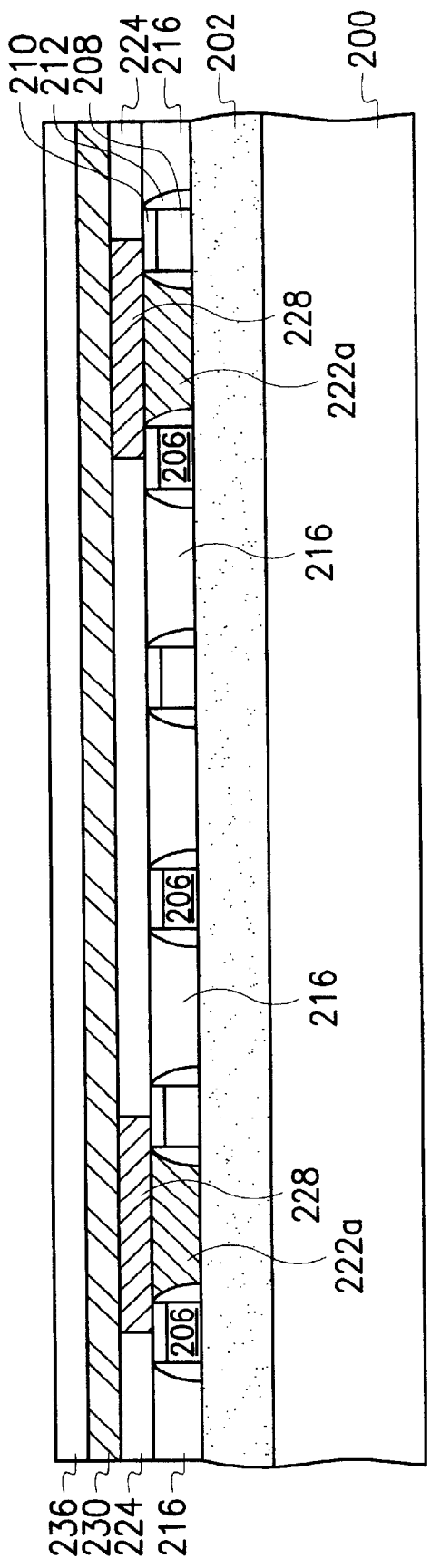
Figure 3I:
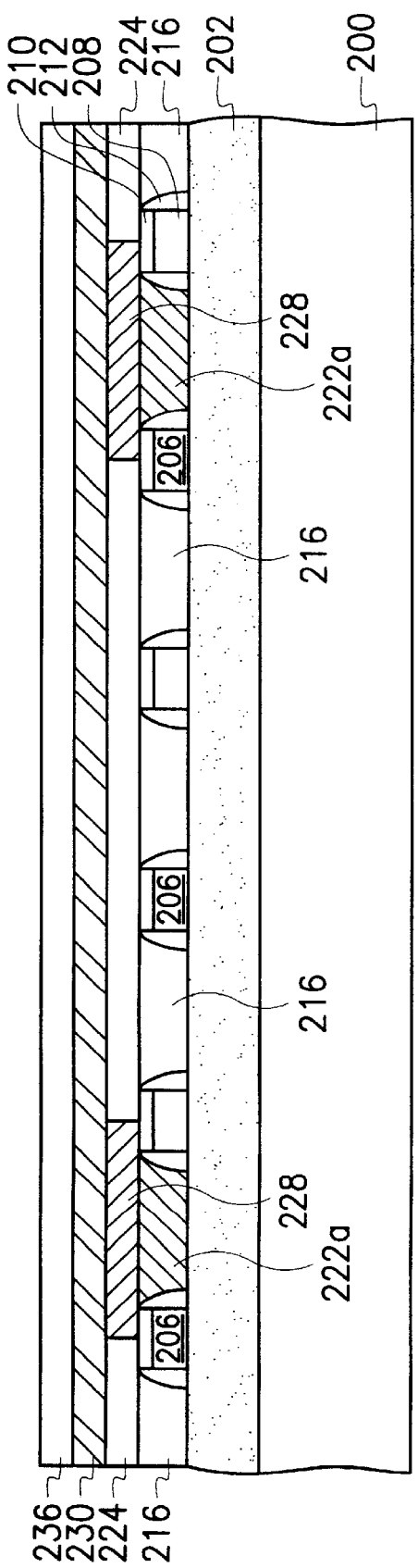
Figure 6B:
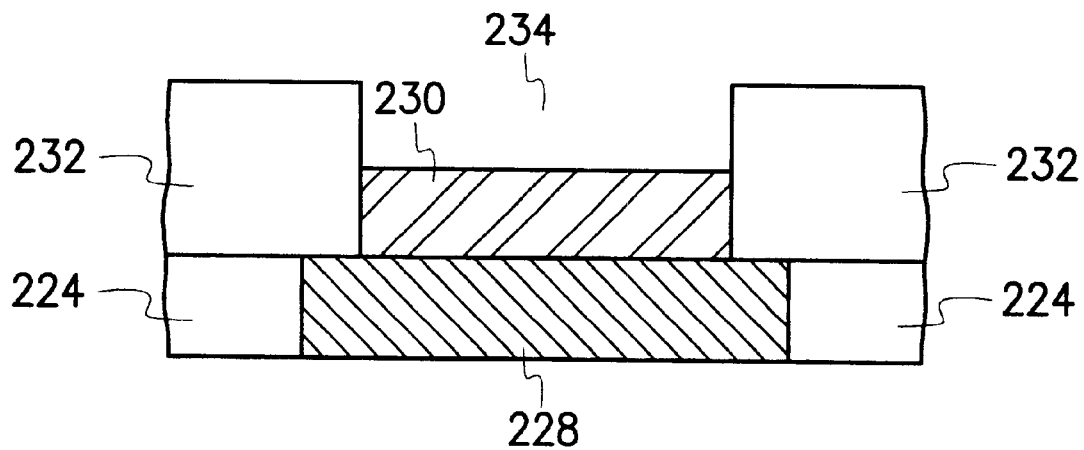
Figure 6C:
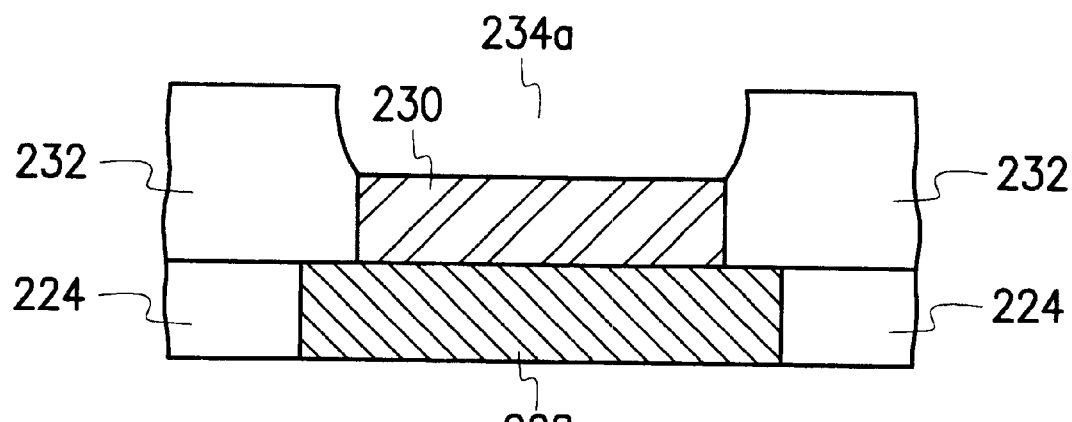
Figure 6D:
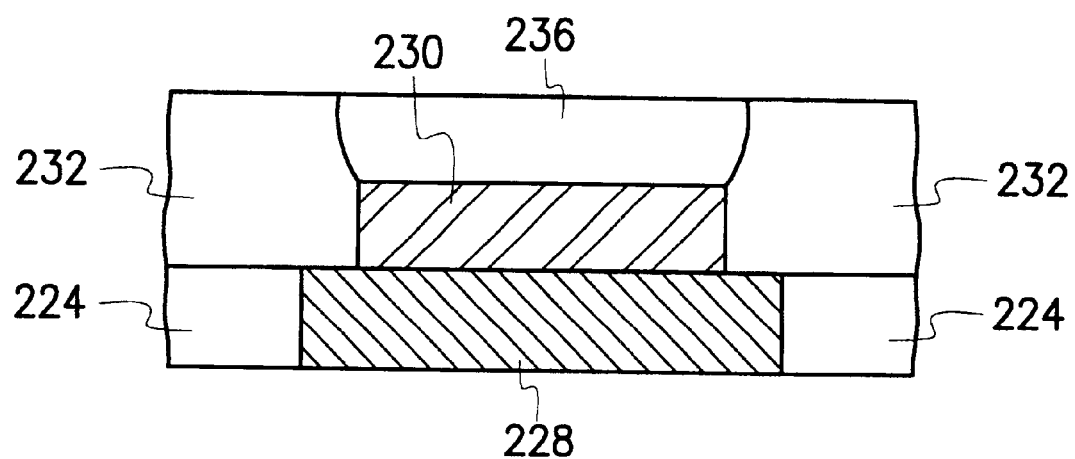

To form a bit line 230 in each trench 234, conductive material such as tungsten is deposited into the trenches 234, for example, by chemical vapor deposition. The conductive material completely fills the trenches 234 and extends over the dielectric layer 232. The conductive layer is etched back to remove not only the excess material above the dielectric layer 232, but also a portion of the conductive material inside the trenches 234 to a certain depth. Hence, only the lower portion of the trenches 234 contains conductive material as shown in FIG. 6B. The bit line 230 is electrically connected to the first plug 222a and the substrate 200 via the bit line contact 228. The top surfaces of the bit lines 230 must be below the dielectric layer 232. In addition, a barrier layer can be inserted between the bit line 230 and the dielectric layer 232 so that adhesive strength between conductive material and oxide material is increased. An isotropic etching operation is carried out etching the dielectric layer 232 so that the opening area in the upper portion of the trenches 234 is widened to form a bowl-shaped opening 234a as shown in FIG. 6C. Hard material 236 such as silicon nitride is deposited into the bowl-shaped openings 234a by chemical vapor deposition. Some of the hard material 236 is deposited over the dielectric layer 232. Excess hard material 236 above the dielectric layer is removed by chemical-mechanical polishing using the dielectric layer 232 as a polishing stop layer to form a structure as shown in FIGS. 6D and 3G. The widened opening 234a increases the exposed surface area of the hard material layer 236. Consequently, damage to underlying bit line 230 is minimized when node contact opening is subsequently formed.

Figure 2H:
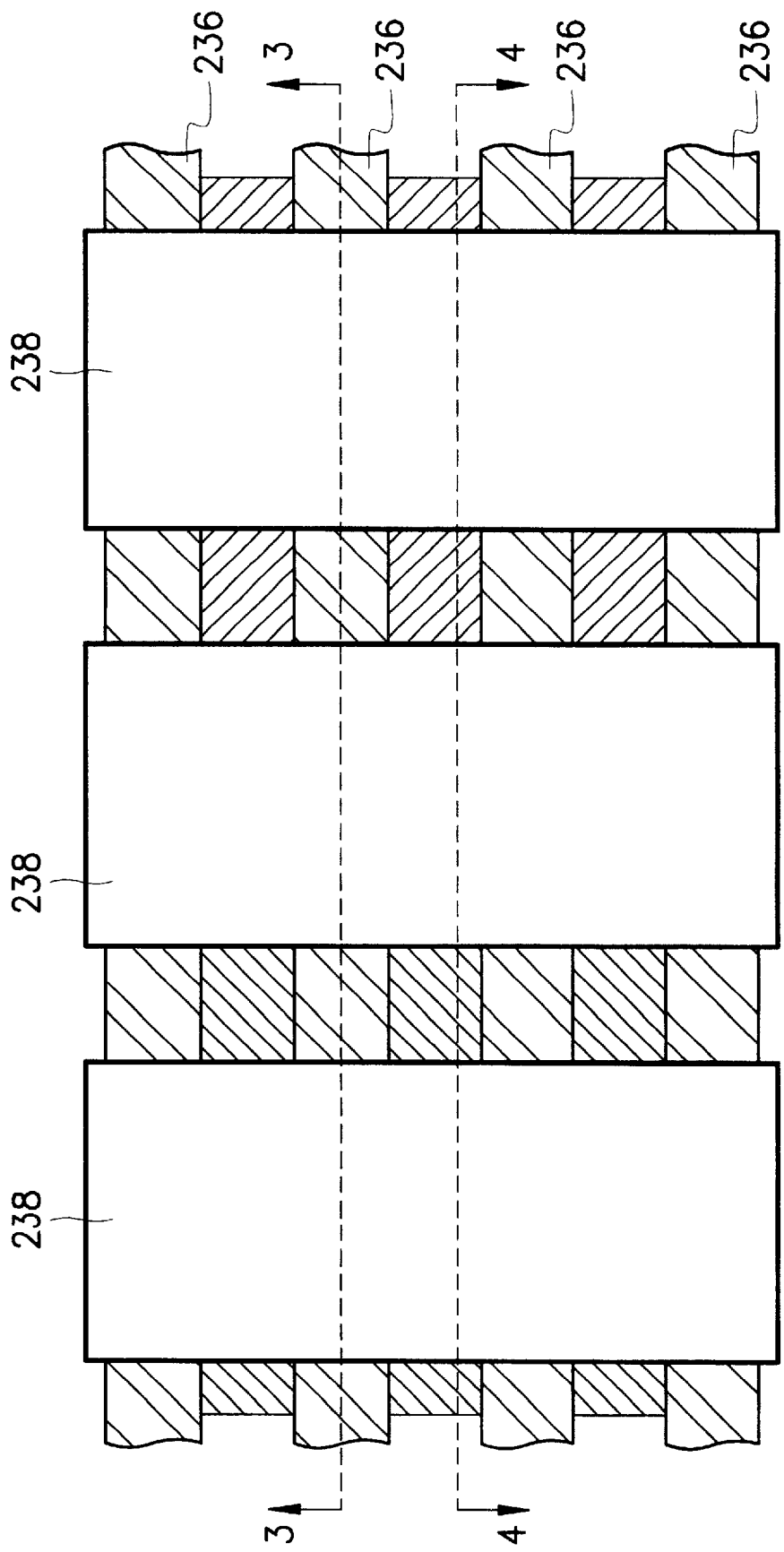

As shown in FIGS. 2H, 3H and 4H, a space node contact photoresist pattern 238 is formed over the dielectric layer 232 and the hard material layer 236. The photoresist pattern 238 exposes the desired node contact positions. The dielectric layer 232 and the insulation layer 224 are etched using the photoresist pattern 238 as a mask to form a node contact opening 240 that exposes the second plug 222b. Since the bit line 230 is covered by the hard material layer 236, the lower etching rate of the hard material layer 236 relative to the dielectric layer 232 prevents any damages to the underlying bit line 230. Because the exposed dielectric layer 232 is the only material removed in the etching step, the node contact opening 240 is self-aligned with the second plug 222b. The photoresist layer 238 is removed after the node contact opening 240 is formed.

Figure 2I:
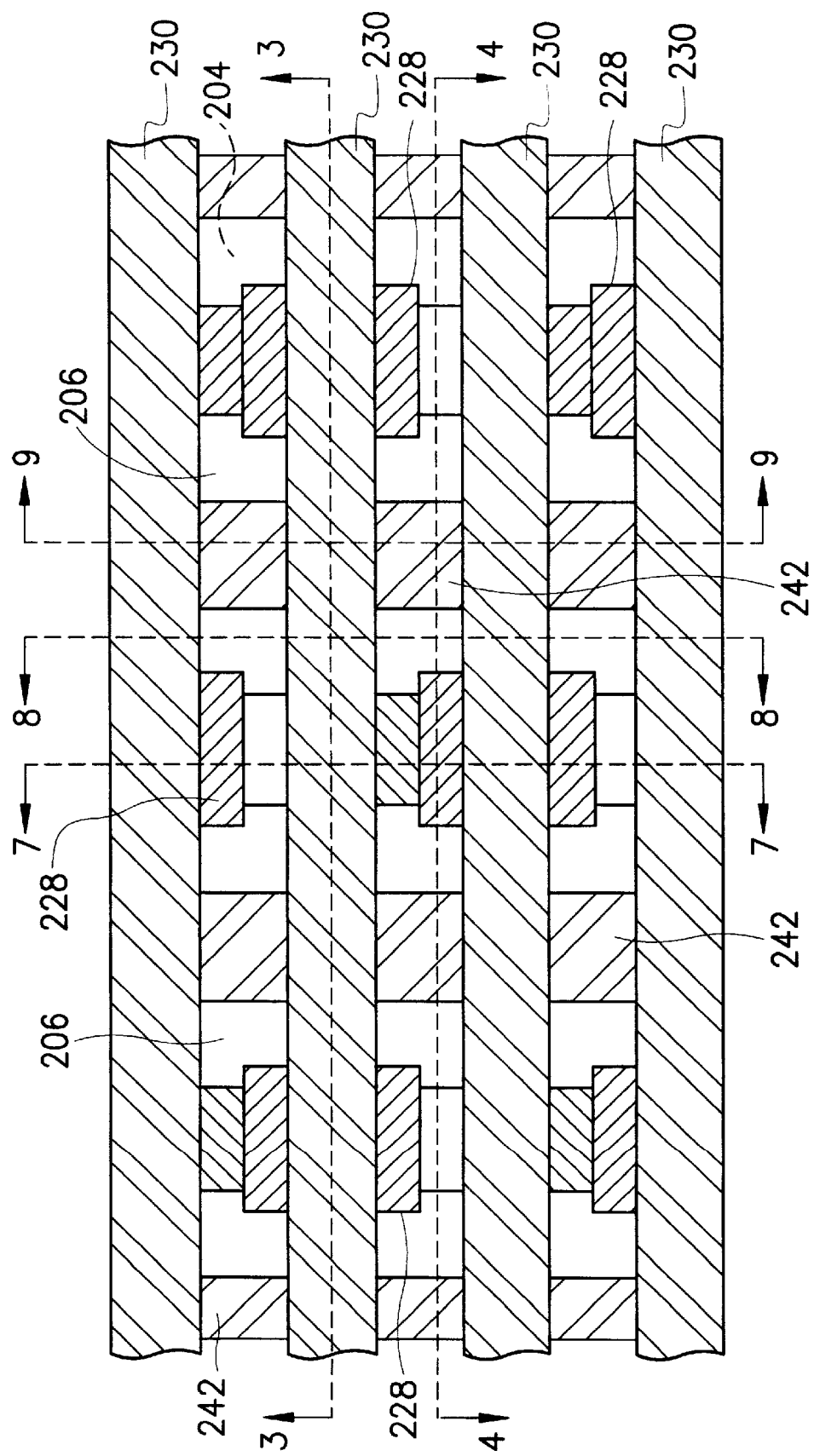
Figure 4G:
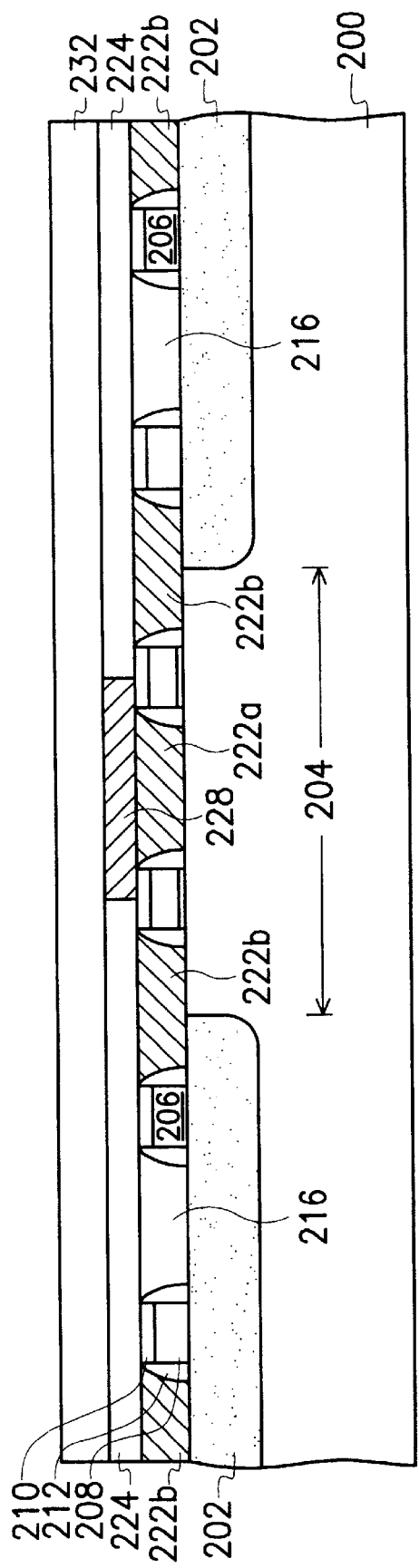
Figure 4I:
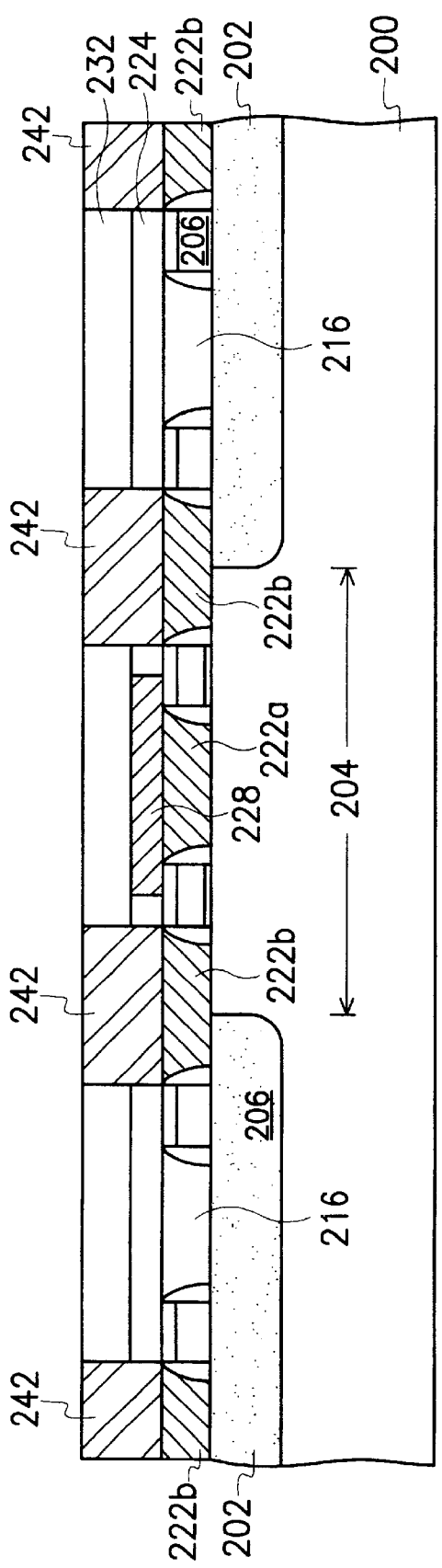
Figure 7:
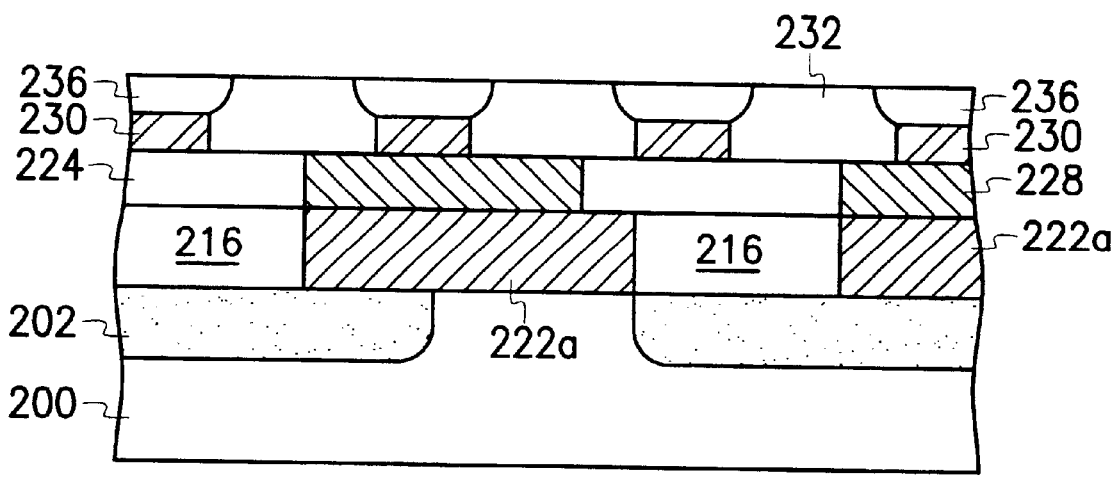
FIGS. 7 through 9 are cross-sectional views showing the structures along line 7—7, 8—8 and 9—9 shown in FIG. 2I.
Figure 8:
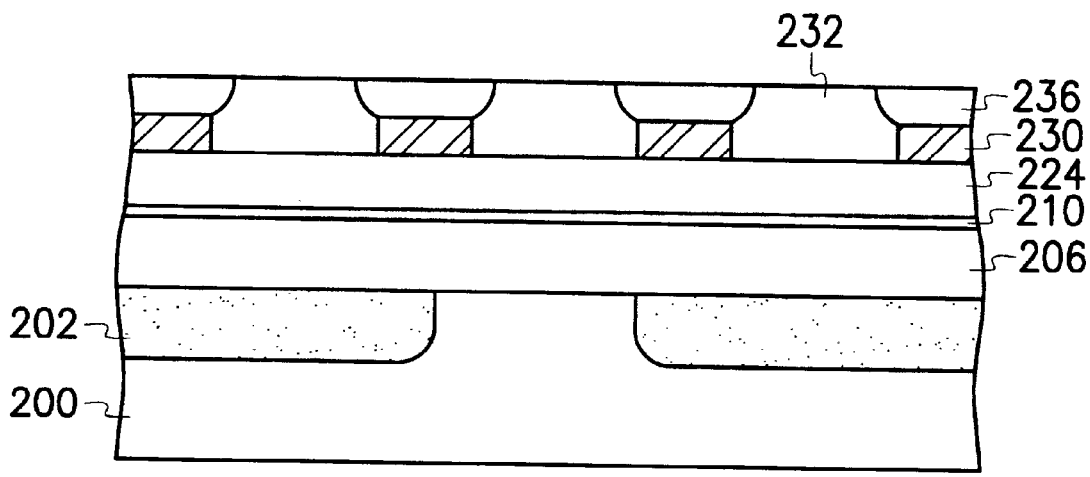
Figure 9:
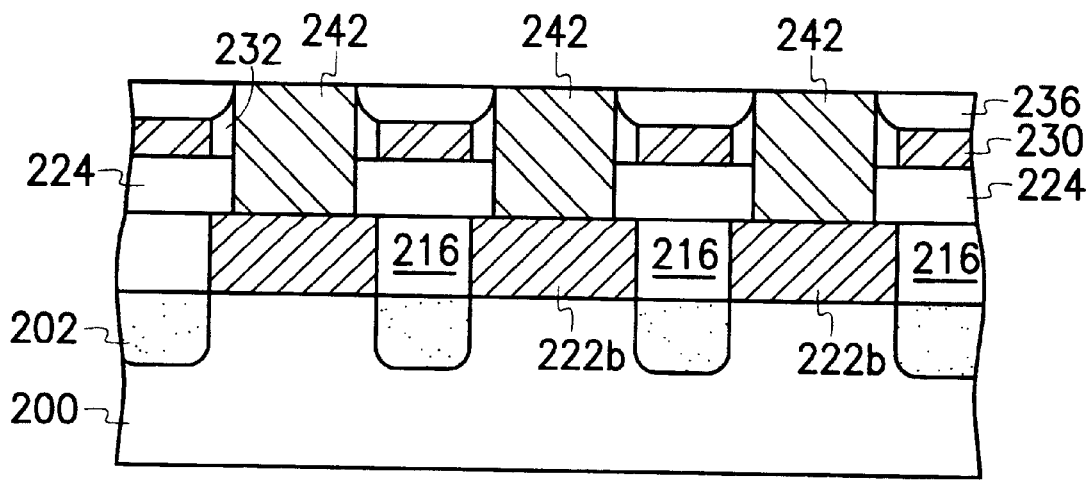

FIGS. 7 through 9 are cross-sectional views showing the structures along line 7—7, 8—8 and 9—9 shown in FIG. 2I. As shown in FIGS. 2I, 3I, 4I and 7, conductive material such as polysilicon or tungsten is deposited into the node contact openings 240 filling the node contact opening 240 and covering the dielectric layer 232. Excess conductive material above the dielectric layer 232 is removed by chemical-mechanical polishing to form node contacts 242 as shown in FIG. 4I. Each node contact 242 is electrically connected to the substrate 200 via the second plug 222b. Since the bowl-shaped opening 234a (FIG. 6C) in the hard material layer 236 has a larger surface area than the bit line 230, the bit line 230 is prevented from any damages when the node contact 242 is formed.

After fabrication of the memory array structure, other conventional processes may be used to form capacitors such as cylindrical or crown-shaped capacitors.

In summary, the self-aligned contacts 222a and 222b and the node contact 242 are formed in a self-aligned contact process. Therefore, both process window and overlay margin are increased. Furthermore, the use of non-continuous T-shaped island photoresist pattern 218 for forming the self-aligned contacts and the use of linear/space photoresist pattern for forming the node contacts are able to increase the process window.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a dynamic random access memory (DRAM) capacitor, comprising the steps of:

providing a substrate;

forming a plurality of active regions in the substrate by patterning;

forming a plurality of parallel word lines above the substrate, wherein the word lines are separated from each other by a space;

depositing insulation material into the space between word lines to form a first insulation layer;

patterning the first insulation layer to form a first self-aligned contact opening for producing a bit line contact and a second self-aligned contact opening for producing a node contact;

depositing conductive material into the first self-aligned contact opening and the second self-aligned contact opening to form a first self-aligned contact and a second self-aligned contact, respectively;

forming a second insulation layer over the word lines;

patterning the second insulation layer to form a bit line contact opening;

depositing conductive material into the bit line contact opening to form a bit line contact so that the bit line contact is electrically connected to the substrate via the first self-aligned contact;

forming a dielectric layer over the second insulation layer;

patterning the dielectric layer to form a plurality of parallel trenches perpendicular to the word lines;

depositing conductive material into the trenches to form a plurality of bit lines such that a top surface of the bit line is at a level below a top surface of the dielectric layer and the bit line is electrically connected to the first self-aligned contact via the bit line contact;

forming a hard material layer over the bit line so that the trenches are filled;

patterning the dielectric layer and the second insulation layer to form a node contact opening; and depositing conductive material into the node contact opening to form a node contact, wherein the node contact is electrically connected to the substrate via the second self-aligned contact.

2. The method of claim 1, wherein the step of patterning out active regions includes forming shallow trench isolation structures.

3. The method of claim 1, wherein the step of forming the word lines includes sequentially forming a conductive layer and an insulation layer over the substrate, patterning the conductive layer and the insulation layer to form a plurality of parallel lines, and forming hard material spacers on sidewalls of the lines.

4. The method of claim 1, wherein after the step of forming the word lines, further includes forming source/drain regions in the substrate on each side of the word lines.

5. The method of claim 1, wherein the step of forming the first insulation layer further includes the sub-steps of:
depositing insulation material into the space between the word lines and over the word lines; and
removing excess insulation material above the word line by chemical-mechanical polishing.

6. The method of claim 1, wherein the step of forming the first self-aligned contact opening and the second self-aligned contact opening includes the sub-steps of:
forming a non-continuous T-shaped island photoresist pattern over the word lines and the first insulation layer; and
etching a portion of the first insulation layer in the space to expose a portion of the substrate while using the T-shaped island photoresist pattern as an etching mask.

7. The method of claim 1, wherein the step of forming the first self-aligned contact and the second self-aligned contact includes the sub-steps of:
depositing conductive material into the first self-aligned contact opening and the second self-aligned contact opening and above the word lines and the first insulation layer; and
removing excess conductive material above the word lines by chemical-mechanical polishing so that the word lines are exposed.

8. The method of claim 1, wherein the step of forming the bit line contact opening includes the sub-steps of:
forming a bit line contact opening photoresist pattern over the second insulation layer; and
etching the second insulation layer to expose the first self-aligned contact while using the bit line contact opening photoresist pattern as an etching mask.

9. The method of claim 1, wherein the step of forming the bit line contact includes the sub-steps of:
depositing conductive material into the bit line contact opening and over the second insulation layer; and
removing excess conductive material above the second insulation layer to expose the second insulation layer by chemical-mechanical polishing.

10. The method of claim 1, wherein the step of forming the trenches includes the sub-steps of:
forming a line/space bit line photoresist pattern over the dielectric layer; and
etching the dielectric layer to expose the bit line contact while using the line/space bit line photoresist pattern as an etching mask.

11. The method of claim 1, wherein the step of forming the bit lines includes the sub-steps of:
depositing conductive material into the trenches and over the dielectric layer; and
etching back the conductive material to form the bit lines and expose the dielectric layer such that the conductive material occupies each trench only up to a certain depth.

12. The method of claim 1, wherein after the step of forming the bit lines but before the step of depositing hard material, further includes an isotropic etching of the trenches so that a bowl-shaped opening is formed the upper portions of the trenches.

13. The method of claim 1, wherein the step of depositing hard material further includes the sub-steps of:
depositing hard material into the trenches and over the dielectric layer; and
removing excess hard material above the dielectric layer to expose the dielectric layer by chemical-mechanical polishing.

14. The method of claim 1, wherein the step of forming the node contact opening includes the sub-steps of:
forming a line/space node contact opening photoresist pattern over the hard material layer and the dielectric layer; and
etching the dielectric layer and the second insulation layer to expose a portion of the substrate while using the node contact opening photoresist pattern as an etching mask.

15. The method of claim 1, wherein the step of forming the node contact includes the sub-steps of:
depositing conductive material into the node contact opening and over the dielectric layer and the hard material layer; and
removing excess conductive layer to expose the dielectric layer and the hard material layer.

16. The method of claim 1, wherein the step of forming the first self-aligned contact opening and the second self-aligned contact opening includes the sub-steps of:
forming a continuous self-aligned contact opening photoresist pattern over the word lines and the first insulation layer; and
etching to remove a portion of the first insulation layer in the intermediate space, while using the continuous self-aligned contact opening photoresist pattern as an etching mask, so that a portion of the substrate is exposed.

17. A method of manufacturing dynamical random access memory (DRAM) capacitor, comprising the steps of:
providing a substrate;
forming a plurality of active regions in the substrate;
forming a plurality of parallel word lines above the substrate;
forming a first plug and a second plug between the word lines in the desired positions for forming the bit line contact and the node contact;
depositing insulation material into the space between the word lines;
forming a bit line contact above the first plug;
forming a plurality of parallel bit lines perpendicular to the word lines, wherein the bit line is electrically connected to the first plug and the substrate via the bit line contact, the bit lines are electrically insulated from each other and each bit line is covered by a hard material layer; and
forming a node contact above the second plug.

18. The method of claim 17, wherein the step of patterning out active regions includes forming an isolation structure.

19. The method of claim 17, wherein the step of forming the word lines includes sequentially forming a conductive layer and an insulation layer over the substrate, patterning the conductive layer and the insulation layer to form a plurality of parallel word lines, and forming hard material spacers on sidewalls of the word lines.

20. The method of claim 19, wherein the step of forming the insulation layer and the hard material layer includes depositing silicon nitride.

21. The method of claim 17, wherein after the step of forming the word lines, further includes forming source/drain regions in the substrate on each side of the word lines.

22. The method of claim 17, wherein the step of forming the first plug and the second plug includes the sub-steps of:

depositing conductive material into the space between the word lines while exposing top surfaces of the word lines;

removing a portion of the conductive material to form the bit line contact plug and the node contact plug in the desired positions so that a portion of the substrate is exposed; and depositing insulation material back into the space left after removing a portion of the conductive layer to form the first plug and the second plug, wherein the first plug and the second plug serve as a portion of the bit line contact and a portion of the node contact, respectively.

23. The method of claim 17, wherein the step of forming the bit line contact includes depositing insulation material over the word line and removing a portion of the insulation layer to form an opening that exposes the first plug and depositing insulation material into the opening.

24. The method of claim 17, wherein the step of forming the bit lines includes the sub-steps of:

forming a blanket dielectric layer over the substrate;

removing a portion of the blanket dielectric layer to form a plurality of trenches perpendicular to the word lines such that the trenches also expose the bit line contacts;

depositing conductive material into the trenches and then etching back so that a top surface of the conductive layer is lower than a top surface of the dielectric layer, wherein the conductive layer functions as a bit line; and performing an isotropic etching of the trenches so that a bowl-shaped opening is formed the upper portions of the trenches;

depositing hard material into the trenches and over the dielectric layer; and removing excess hard material above the dielectric layer to expose the dielectric layer by chemical-mechanical polishing.

25. The method of claim 17, wherein the step of forming the node contact opening includes the sub-steps of:

forming a line/space node contact opening photoresist pattern over the hard material layer and the dielectric layer; and etching the dielectric layer and the second insulation layer to expose a portion of the substrate while using the node contact opening photoresist pattern as an etching mask.

26. The method of claim 17, wherein the step of forming the node contact includes the sub-steps of:

depositing conductive material into the node contact opening and over the dielectric layer and the hard material layer; and removing excess conductive layer to expose the dielectric layer and the hard material layer.

* * * * *